(12) United States Patent
Jung et al.

(10) Patent No.: US 11,726,722 B2
(45) Date of Patent: Aug. 15, 2023

(54) MEMORY DEVICE, MEMORY CONTROLLER, AND MEMORY SYSTEM INCLUDING THE SAME

(71) Applicant: SAMSUNG ELECTRONICS CO., LTD., Suwon-si (KR)

(72) Inventors: Wontaeck Jung, Hwaseong-si (KR); Bohchang Kim, Suwon-si (KR); Kuihan Ko, Seoul (KR); Jaeyong Jeong, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 25 days.

(21) Appl. No.: 17/307,317

(22) Filed: May 4, 2021

(65) Prior Publication Data

US 2022/0050640 A1 Feb. 17, 2022

(30) Foreign Application Priority Data

Aug. 12, 2020 (KR) .................. 10-2020-0101395

(51) Int. Cl.
*G06F 3/06* (2006.01)
*G11C 16/04* (2006.01)
(Continued)

(52) U.S. Cl.
CPC .......... *G06F 3/0679* (2013.01); *G06F 3/0604* (2013.01); *G06F 3/0652* (2013.01);
(Continued)

(58) Field of Classification Search
CPC ...... G05B 13/00–048; G05B 15/00–02; G05B 17/00–02; G06F 1/00–3296;
(Continued)

(56) References Cited

U.S. PATENT DOCUMENTS 8,190,784 B1 * 5/2012 Raizen .................. G06F 3/0604
710/305
8,880,964 B2 11/2014 Wan et al.
(Continued)

FOREIGN PATENT DOCUMENTS

KR 10-1736457 5/2017

OTHER PUBLICATIONS

H. Maejima et al., "A 512Gb 3b/Cell 3D flash memory on a 96-word-line-layer technology," 2018 IEEE International Solid—State Circuits Conference—(ISSCC), San Francisco, CA, USA, 2018, pp. 336-338, doi: 10.1109/ISSCC.2018.8310321. (Year: 2018).*
(Continued)

*Primary Examiner* — Daniel C. Chappell
(74) *Attorney, Agent, or Firm* — F. Chau & Associates, LLC

(57) ABSTRACT

A memory system includes a first memory device including a plurality of first memory blocks each including a plurality of first memory cells stacked in a direction perpendicular to a substrate; and a memory controller configured to control a memory operation of the first memory device. The memory controller is configured to select and operate any one of different control schemes for each of the first memory blocks based on a number of first not-open (N/O) strings included in each of the first memory blocks, respectively.

19 Claims, 31 Drawing Sheets

(51) Int. Cl.
*G11C 16/10* (2006.01)
*G11C 16/14* (2006.01)
*H10B 43/27* (2023.01)

(52) U.S. Cl.
CPC ........ *G06F 3/0655* (2013.01); *G11C 16/0483* (2013.01); *G11C 16/10* (2013.01); *G11C 16/14* (2013.01); *H10B 43/27* (2023.02)

(58) Field of Classification Search
CPC ............... G06F 3/00; G06F 3/06–0689; G06F 5/00–16; G06F 8/00–78; G06F 9/00–548; G06F 11/00–3696; G06F 12/00–16; G06F 13/00–4295; G06F 15/00–825; G06F 16/00–986; G06F 17/00–40; G06F 21/00–88; G06F 2009/3883; G06F 2009/45562–45595; G06F 2015/761–768; G06F 2201/00–885; G06F 2206/00–20; G06F 2209/00–549; G06F 2211/00–902; G06F 2212/00–7211; G06F 2213/00–4004; G06F 2216/00–17; G06F 2221/00–2153; G06K 9/00–6298; G06N 3/00–126; G06N 5/00–048; G06N 7/00–08; G06N 10/00; G06N 20/00–20; G06N 99/00–007; G06T 1/00–60; G06V 30/00–43; G11B 20/00–24; G11B 33/00–1493; G11C 11/00–5692; G11C 13/00–06; G11C 14/00–009; G11C 15/00–06; G11C 16/00–3495; G11C 17/00–18; G11C 2207/00–229; G11C 2216/00–30; H01L 25/00–50; H01L 27/00–3293; H01L 2225/00–1094; H03M 7/00–707; H04L 9/00–38; H04L 12/00–66; H04L 41/00–5096; H04L 49/00–9094; H04L 61/00–59; H04L 67/00–75

See application file for complete search history.

(56) References Cited

U.S. PATENT DOCUMENTS

| | | | |
|---|---|---|---|
| 8,958,247 B2 | 2/2015 | Asaoka et al. | |
| 9,053,978 B2* | 6/2015 | Nam | G11C 16/3445 |
| 9,318,224 B2* | 4/2016 | Kwak | G11C 29/82 |
| 9,466,386 B2* | 10/2016 | Park | G11C 16/225 |
| 9,891,848 B2 | 2/2018 | Asami et al. | |
| 10,026,482 B2 | 7/2018 | Yamauchi | |
| 2008/0005475 A1* | 1/2008 | Lubbers | G06F 3/0676 |
| | | | 711/118 |
| 2008/0198651 A1* | 8/2008 | Kim | G11C 16/0483 |
| | | | 365/185.03 |
| 2009/0327591 A1* | 12/2009 | Moshayedi | G06F 3/0659 |
| | | | 711/E12.001 |
| 2013/0016561 A1* | 1/2013 | Nam | G11C 16/14 |
| | | | 365/185.11 |
| 2014/0164685 A1* | 6/2014 | Kwak | G11C 16/0483 |
| | | | 711/103 |
| 2015/0032841 A1* | 1/2015 | Vasudevan | G06F 3/0613 |
| | | | 709/216 |
| 2015/0049549 A1 | 2/2015 | Asaoka | |
| 2016/0283112 A1* | 9/2016 | Blankenship | G06F 3/0671 |
| 2019/0042087 A1* | 2/2019 | Zhu | G06F 3/0679 |
| 2019/0138240 A1* | 5/2019 | Gayen | G06F 3/0604 |
| 2019/0268141 A1* | 8/2019 | Pandurangan | G06F 3/0679 |
| 2019/0324523 A1* | 10/2019 | Jen | H04L 12/4625 |
| 2020/0065013 A1* | 2/2020 | Griffith | G06F 3/0604 |
| 2020/0089537 A1* | 3/2020 | Bahirat et al. | G06F 9/468 |

OTHER PUBLICATIONS

M.-S. Seo, S.-k. Park and T. Endoh, "The 3-dimensional vertical FG NAND flash memory cell arrays with the novel electrical S/D technique using the Extended Sidewall Control Gate (ESCG)," 2010 IEEE International Memory Workshop, Seoul, Korea (South), 2010, pp. 1-4, doi: 10.1109/IMW.2010.5488392. (Year: 2010).*

S. H. S. Rezaei, M. Modarressi, R. Ausavarungnirun, M. Sadrosadati, O. Mutlu and M. Daneshtalab, "NoM: Network-on-Memory for Inter-Bank Data Transfer in Highly-Banked Memories," in IEEE Computer Architecture Letters, vol. 19, No. 1, pp. 80-83, Jan. 1-Jun. 2020, doi: 10.1109/LCA.2020.2990599. (Year: 2020).*

W.-C. Kwon, S.-M. Hong, S. Yoo, B. Min, K.-M. Choi and S.-K. Eo, "An Open-Loop Flow Control Scheme Based on the Accurate Global Information of On-Chip Communication," 2008 Design, Automation and Test in Europe, Munich, Germany, 2008, pp. 1244-1249, doi: 10.1109/DATE.2008.4484849. (Year: 2008).*

* cited by examiner

| BLK | Number of N/O Strings |
|---|---|
| BLK1 | A |
| BLK2 | B |
| BLK3 | C |

| N/O STRING DETECTION | TARGET DATA CONVERSION | WRITING |

FIG. 8B

| | DT_STEP |
|---|---|
| BL | VBL1(VCC) |
| Selected SSL | VSSL1(On) |
| Unselected SSL | VSSL2(Off) |
| WL | VCK |
| GSL | VGSL1(On) |
| CSL | VCSL(VSS) |
| Substrate | VSUB(VSS) |

FIG. 10A

| | E_STEP |
|---|---|
| BL | Float |
| Selected SSL | Float or VSSL3 |
| Unselected SSL | |
| WL | Vwe (VSS) |
| GSL | Float or VGSL2 |
| CSL | Float |
| Substrate | Vers1/Vers2 |

FIG. 11A

| BLK | Cell Type |
|---|---|
| BLK1 | TLC |
| BLK2 | TLC |
| BLK3 | SLC |

| BLK | Hot/Cold Data |
|---|---|
| BLK1 | C |
| BLK2 | C |
| BLK3 | H |

| BLK | Sub_BLK | Number of N/O Strings |
|---|---|---|
| BLK1 | SB11 | A1 |
| | SB12 | A2 |
| BLK2 | SB21 | B1 |
| | SB22 | B2 |
| BLK3 | SB31 | C1 |
| | SB32 | C2 |

| MD | BLK | Number of N/O Strings |
|---|---|---|
| MD1 | BLK11 | A1 |
| | BLK12 | B1 |
| | BLK13 | C1 |
| MD2 | BLK21 | A2 |
| | BLK22 | B2 |
| | BLK23 | C2 |
| MD3 | BLK31 | A3 |
| | BLK32 | B3 |
| | BLK33 | C3 |

FIG. 17A

| MD | Cell Type |
|---|---|
| MD1 | TLC |
| MD2 | TLC |
| MD3 | SLC |

| MD | Hot/Cold Data |
|---|---|
| MD1 | C |
| MD2 | C |
| MD3 | H |

TB7

MEMORY DEVICE, MEMORY CONTROLLER, AND MEMORY SYSTEM INCLUDING THE SAME

CROSS-REFERENCE TO RELATED APPLICATION

This application is related to and claims priority under 35 U.S.C. § 119 to Korean Patent Application No. 10-2020-0101395, filed on Aug. 12, 2020, in the Korean Intellectual Property Office, the disclosure of which is incorporated by reference herein in its entirety.

TECHNICAL FIELD

This disclosure relates generally to memory devices more particularly to a memory device including at least one not-open string, a controller for controlling the memory device, and a memory system including the same.

DISCUSSION OF THE RELATED ART

With the recent development of data technology, a 3-dimensional (3D) memory device having high integration is in demand for the storage of a vast amount of data with high reliability. However, in a 3D memory device, a "not-open string" (or "off-string") is a memory defect in which a channel is not formed in the memory string. An N/O string, sometimes called a memory hole failure, may be formed during manufacturing due to a process error. Writing data in memory cells of a not-open string has been found difficult, even when error correction coding (ECC) is applied to the data. Further, the memory cells of a not-open string may adversely affect neighboring memory cells of "open" (normal) strings. Therefore, a technology to resolve problems caused by N/O strings is in demand.

SUMMARY

Embodiments of the inventive concept provide a memory device, a memory controller, and a memory system including the same to minimize adverse effects caused by not-open strings and optimizing operation of a memory operation by applying different control schemes to memory blocks with not-open strings vs. memory blocks without any not-open strings.

According to an aspect of the inventive concept, there is provided a memory system including a first memory device including a plurality of first memory blocks each including a plurality of first memory cells stacked in a direction perpendicular to a substrate; and a memory controller configured to control a memory operation of the first memory device. The memory controller is configured to select and operate any one from among different control schemes for each of the first memory blocks based on a number of first not-open (N/O) strings included in each of the first memory blocks, respectively.

According to another aspect of the inventive concept, there is provided a memory device including a memory cell array configured to include a plurality of memory blocks each including a plurality of memory cells stacked in a direction perpendicular to a substrate; and control logic configured to detect an N/O string in a first target memory block from among the memory blocks in response to a first type command received from the outside, convert a plurality of bits of target data intended to be written to a plurality of target memory cells included in the detected N/O string to have a predetermined value for restricting the number of times for applying a write voltage, and perform a general write operation for a second target memory block from among the memory blocks in response to a second type of command received from the outside.

According to another aspect of the inventive concept, there is provided a memory controller including an internal memory configured to store N/O string information regarding the number of not-open (N/O) strings included in each of a plurality of memory blocks included in an external memory device; and a processor configured to, based on the N/O string information, operate first target memory blocks including at least one N/O string from among the memory blocks according to a first control scheme and to operate second target memory blocks not including the N/O string according to a second control scheme different from the first control scheme.

In another aspect, a memory device includes: a memory cell region comprising a first metal pad; a peripheral circuit region, which comprises a second metal pad and is configured to be vertically connected to the memory cell region through the first metal pad and the second metal pad; a memory cell array comprising a plurality of memory blocks each including a plurality of memory cells stacked in a direction perpendicular to a substrate, in the memory cell region; and control logic configured to, in the peripheral circuit region, detect a not-open (N/O) string in a first target memory block from among the memory blocks in response to a first type of command received by the memory device, convert a plurality of bits of target data intended to be written to a plurality of target memory cells included in the detected N/O string to have a predetermined value for restricting a number of times for applying a write voltage, and perform a general write operation for a second target memory block from among the memory blocks in response to a second type of command received by the memory device.

In another aspect, a memory device includes: a memory cell array comprising a plurality of memory blocks each comprising a plurality of memory cells stacked in a direction perpendicular to a substrate; and control logic configured to detect a not-open (N/O) string in a first target memory block from among the memory blocks in response to a first type of command received by the memory device, refrain from writing target data previously designated to be written to a plurality of target memory cells included in the detected N/O string and instead write data bits each having a predetermined value to the plurality of target memory cells, for restricting a number of times for applying a write voltage to the plurality of target memory cells, and perform a general write operation for a second target memory block from among the memory blocks in response to a second type of write command received by the memory device.

BRIEF DESCRIPTION OF THE DRAWINGS

Embodiments of the inventive concept will be more clearly understood from the following detailed description taken in conjunction with the accompanying drawings in which:

FIGS. 4A, 4B and 4C are diagrams for describing operations for a first type command and a second type command of FIG. 3A in detail;

FIGS. 8A, 8B and 8C are diagrams for describing a method of operating a memory device in response to the first type command of FIG. 4A;

FIGS. 10A, 10B and 10C are diagrams for describing a method of operating a memory device in response to first and second type erase commands of FIG. 4A;

FIGS. 11A and 11B are diagrams for describing the first and second type memory blocks of FIG. 3B in detail;

FIGS. 12A, 12B and 12C are diagrams for describing in detail an embodiment of selecting and operating any one of different control schemes for each of sub-blocks included in a memory block;

FIG. 15 is a table showing an example of N/O string information of FIG. 14;

FIGS. 17A and 17B are diagrams for describing the first and second type memory devices of FIG. 16 in detail.

DETAILED DESCRIPTION OF EMBODIMENTS

Hereinafter, embodiments of the inventive concept may be described with reference to NAND flash memory, and particularly, to vertical NAND flash memory. However, the inventive concept may be also be applied to various non-volatile memory devices such as electrically erasable programmable read-only memory (EEPROM), a NOR flash memory device, phase-change random access memory (PRAM), magnetic random access memory (MRAM), resistive random access memory (RRAM), and ferroelectric random access memory (FRAM). Herein, a memory device may be referred to as a memory chip.

Figure 1:
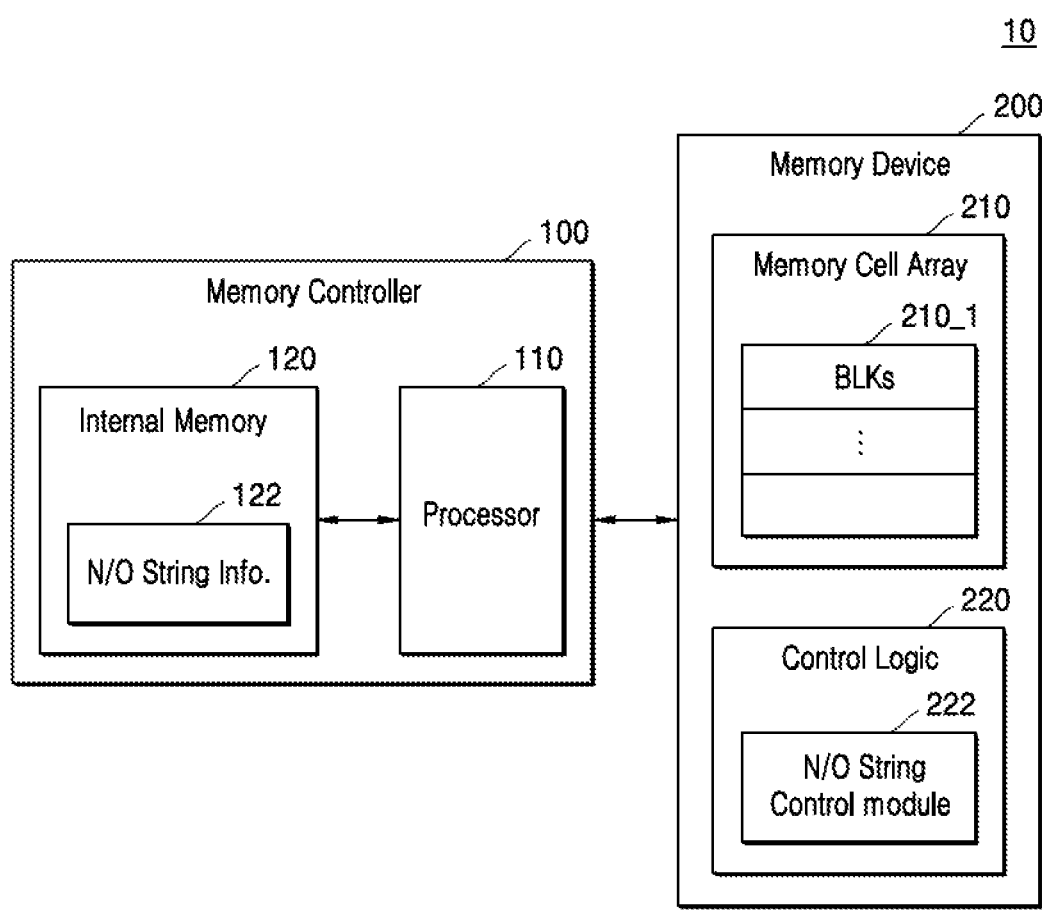
FIG. 1 is a block diagram showing a memory system according to an example embodiment of the inventive concept.
Figure 2:
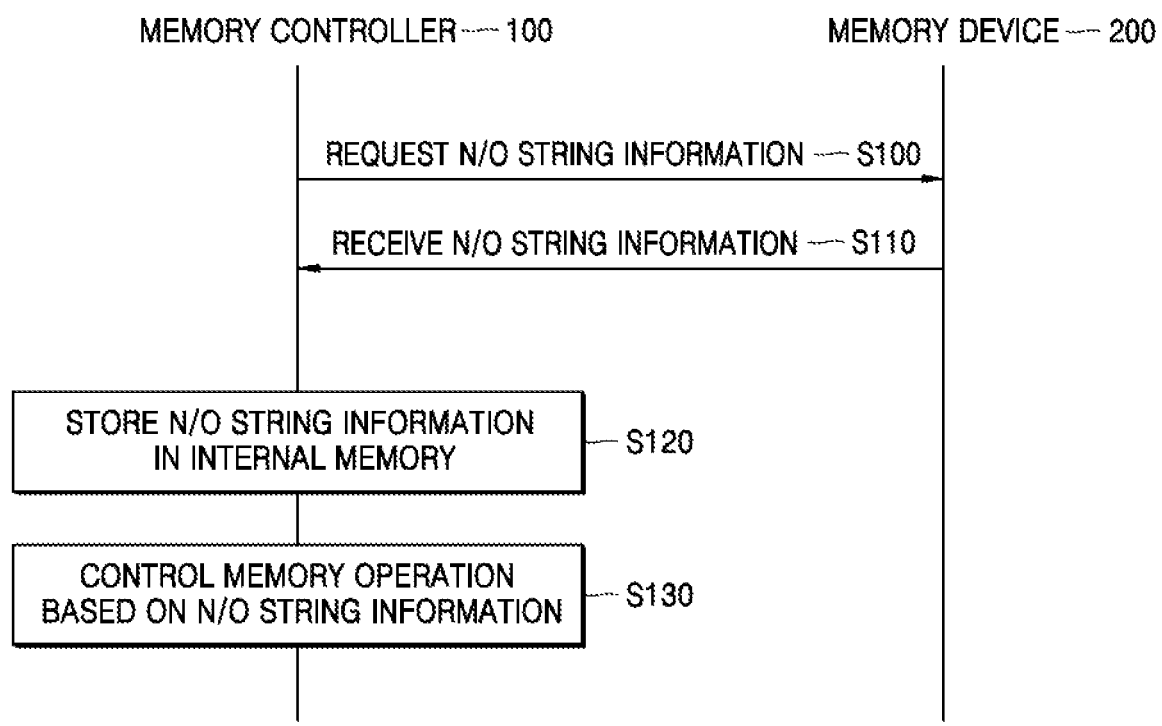
FIG. 2 is a diagram for describing an operation of a memory device according to an example embodiment of the inventive concept.

FIG. 1 is a block diagram showing a memory system 10 according to an example embodiment of the inventive concept, and FIG. 2 is a diagram for describing the operation of the memory system 10 according to an example embodiment of the inventive concept.

Referring to FIG. 1, the memory system 10 may include a memory controller 100 and a memory device 200. The memory controller 100 may include a processor 110 and an internal memory 120. The processor 110 may control the overall operation of the memory system 10 including the memory controller 100 and may control memory operations such as a write operation, a read operation, or an erase operation of the memory device 200. (Herein, a write operation may sometimes be referred to as a "program" operation.) The internal memory 120 may store not-open string (hereinafter referred to as N/O string) information 122 that becomes the basis to perform operations according to example embodiments of the inventive concept. Detailed description of an N/O string will be given below with reference to FIG. 5C.

The internal memory 120 may be implemented with a volatile memory like dynamic random access memory (DRAM) and static random access memory (SRAM) and, without being limited thereto, may also be implemented with a non-volatile memory like PRAM and MRAM. In some embodiments, the internal memory 120 may store firmware driven by the processor 110 and may temporarily store data to be written to the memory device 200 or data to be provided to a host. Also, the internal memory 120 may store initial commands, data, and various variables input from the host or various data and information output from the memory device 200.

The memory device 200 may include a memory cell array 210 and control logic 220. The memory cell array 210 may include a plurality of memory blocks 210_1, each including a plurality of memory cells that are stacked in a direction perpendicular to a substrate to form a 3D structure, often referred to as a vertical structure. Some examples of 3D memory structures and how they operate are found in U.S. Pat. Nos. 7,679,133, 8,553,466, 8,654,587, and 8,559,235, and U.S. Patent Application Publication Nos. 2011/0233648 2012/0051138 and 2011/0204420. Any of these types of memory cell array structures/operations (where not conflicting with those described herein) may be applied to the memory cell array 110.

According to an example embodiment of the inventive concept, the processor 110 may execute a control method, selected from among a set of different control methods, some of which may be heterogeneous, for each of the memory blocks 210_1 based on the N/O string information 122. For example, in some embodiments, an overall heterogeneous control method is applied to a memory block when different control schemes are applied to different respective sub-blocks of that memory block. (Hereinafter, operations performed by the processor 110 may sometimes be described as operations of the memory controller 100.) In an example embodiment, the N/O string information 122 may include information regarding the number of N/O strings included in each of the memory blocks 210_1. For example, the N/O string information 122 may include information regarding the number of N/O strings corresponding to each of the memory blocks 210_1. The processor 110 may check the number of N/O strings included in each of the memory blocks 210_1 by referring to the N/O string information 122. The processor 110 may operate a memory block 210_1 corresponding to a number of N/O strings equal to or greater than a predetermined threshold value from among the memory blocks 210_1 according to a first control scheme considering the existence of N/O strings. Also, the processor 110 may operate a memory block 210_1 corresponding to a number of N/O strings less than the predetermined threshold value from among the memory blocks 210_1 according to a second control scheme. In some embodiments, the second control scheme is different from the first control scheme and may correspond to a general memory operation scheme.

The predetermined threshold value is a value set in advance and may be a fixed value or may vary depending on the operating environment of the memory system 10. In some embodiments, as the threshold value may be set to "1", the processor 110 may operate memory blocks including at least one N/O string according to the first control scheme and operate memory blocks without any N/O string according to the second control scheme.

A control scheme according to an example embodiment of the inventive concept may include a write/program operation control scheme, an erase operation control scheme, a control scheme for operating memory blocks as different memory cell types, and a control scheme for designating memory blocks dedicated to store "hot data" or "cold data". Hereinafter, various denoted memory cell types are each assumed to have a different respective storage capacity, e.g., a single level cell (SLC), a multi-level cell (MLC), a triple level cell (TLC), and a quad-level cell (QLC) are memory cell types with progressively higher storage capabilities. For example, each of the memory blocks 210_1, when defect-free with no N/O strings, may be operated normally at its inherent level. For instance, if a QLC type memory block with only QLC cells is determined to be defect-free, a selected control scheme for the QLC memory block may be a QLC type scheme. On the other hand, if the QLC memory block is determined to have a number of N/O strings above a predetermined threshold, an SLC, MLC or TLC type control scheme may be selected and executed for that memory block. Detailed descriptions of control schemes will be given below with reference to FIGS. 3A and 3B.

As the integration of memory cells has significantly improved, a memory block may include a large number of memory cells. The memory block may be divided into a plurality of sub-blocks for fast and flexible memory operation, and thus, a memory operation may be performed on a sub-block basis. According to an example embodiment of the inventive concept, the processor 110 may select and operate any one of different control methods for each of a plurality of sub-blocks defined in each of the memory blocks 210_1 based on the N/O string information 122. Specifically, each of the memory blocks 210_1 may be divided into a sub-block having N/O strings greater than or equal to a threshold and a sub-block having N/O strings less than the threshold. Here, the N/O string information 122 may include information regarding the number of N/O strings of each of sub-blocks included in the memory blocks 210_1. Detailed descriptions of sub-blocks will be given below with reference to FIGS. 12A to 12C.

The memory controller 100 according to an example embodiment of the inventive concept may execute a respective control scheme selected according to the existence of N/O strings for each of the memory blocks 210_1 of the memory device 200, thereby minimizing negative influences caused by N/O strings and optimizing the operation of the memory device 200 including N/O strings in terms of data reliability.

Referring to FIG. 2, in operation S100, the memory controller 100 may request the N/O string information 122 to the memory device 200. In an embodiment, the N/O string information 122 may be generated in advance through a test operation during the manufacturing stage of the memory device 200 and may be stored in some memory cells of the memory cell array 210 of the memory device 200 or in latches included in a peripheral circuit of the memory device 200. In operation S110, in response to the request in operation S100, the memory device 200 may read the N/O string information 122 and provide the read N/O string information 122 to the memory controller 100. In operation S120, the memory controller 100 may store the N/O string information 122 in the internal memory 120. As described above, the internal memory 120 may be implemented by a volatile memory or a non-volatile memory. When the internal memory 120 is implemented by a volatile memory, the internal memory 120 may receive and store the N/O string information 122 from the memory device 200 every time the memory controller 100 is powered on. In operation S130, the memory controller 100 may control memory operations for the memory device 200 based on the N/O string information 122.

Figure 3A:
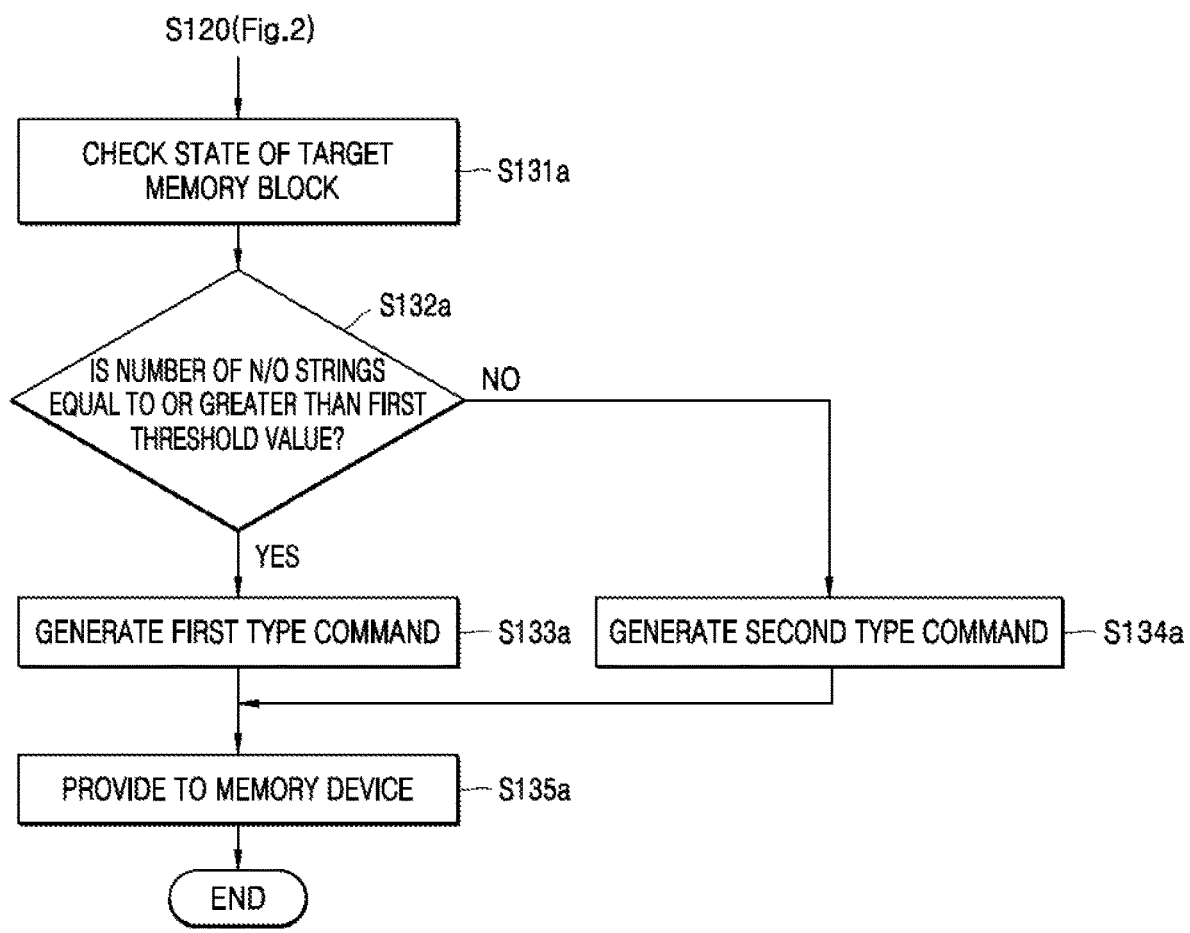
FIGS. 3A and 3B are flowcharts for describing embodiments of operation S130 in FIG. 2 in detail.
Figure 3B:
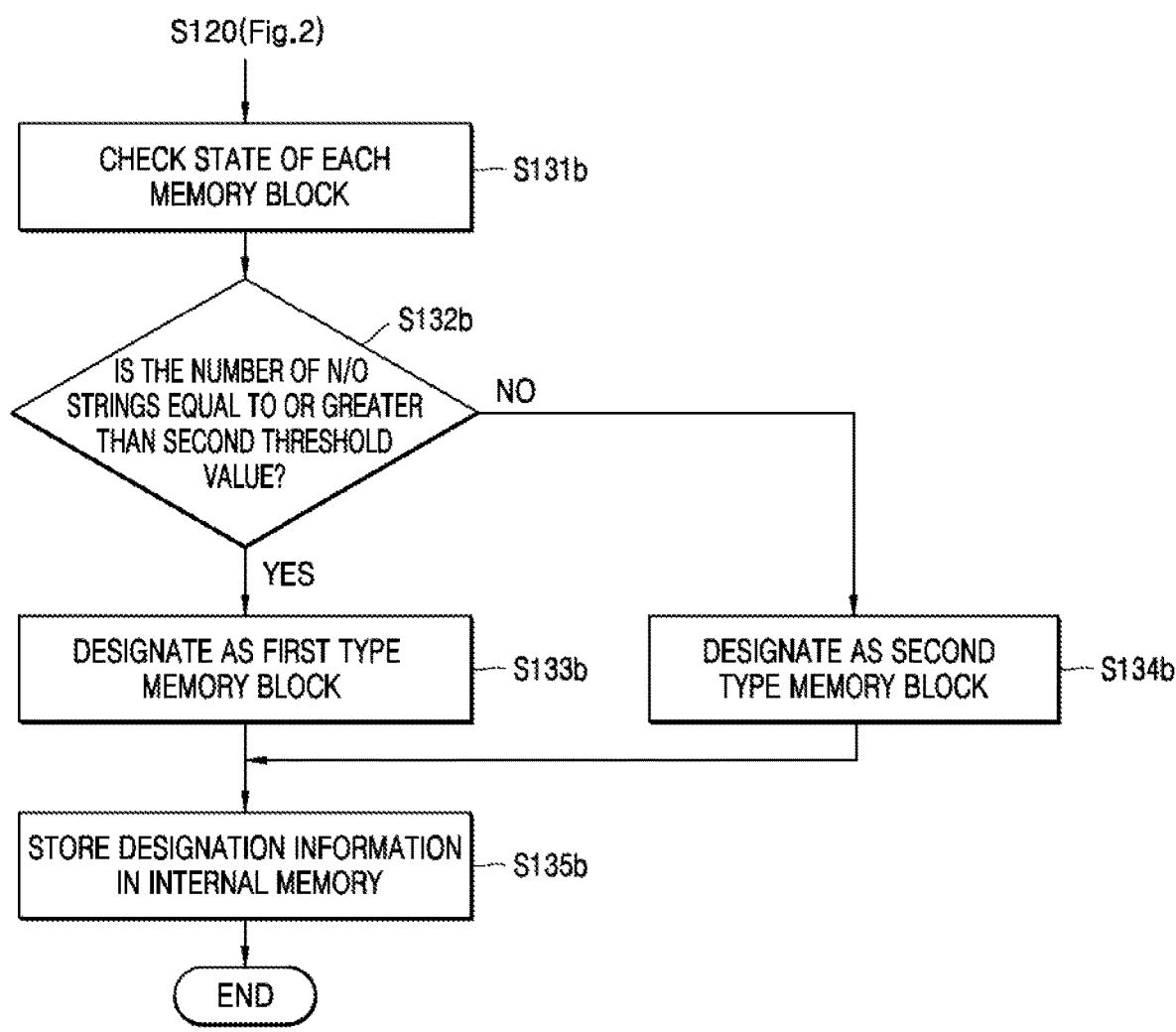

FIGS. 3A and 3B are flowcharts for describing embodiments of operation S130 in FIG. 2 in detail. Hereinafter, descriptions will be given with reference to FIG. 1 for convenience of explanation.

Referring to FIG. 3A, following operation S120 (FIG. 2), in operation S131a, the memory controller 100 may refer to the N/O string information 122 and check a state of a target memory block to be controlled from among the memory blocks 210_1. In other words, the memory controller 100 may check the number of N/O strings included in the target memory block and may select a control scheme for operating the target memory block. In operation S132a, the memory controller 100 may check whether the number of N/O strings included in the target memory block is equal to or greater than a first threshold value. In an example embodiment, the first threshold value may be one of various values set in advance. In some embodiments, the first threshold value may be set to '1', such that memory blocks including N/O strings and memory blocks with N/O strings may be controlled according to different control schemes.

When operation S132a is 'Yes', in operation S133a, the memory controller 100 may generate a first type command for controlling a memory operation of the target memory block. The first type command may refer to a command for controlling a memory operation for minimizing a negative influence of N/O strings with respect to a target memory block having a number of N/O strings equal to or greater than the first threshold value. When operation S132a is 'No', in operation S134a, the memory controller 100 may generate a second type command for controlling a memory operation of the target memory block. The second type command may refer to a command for controlling a general memory operation for a target memory block having a number of N/O strings less than the first threshold value. In operation S135a, the memory controller 100 may provide a first type command or a second type command to the memory device 200, thereby controlling a memory operation for a target memory block. Meanwhile, in an example embodiment, a first type command and a second type command may have different voltage levels and/or pulse sequences.

Referring to FIG. 3B, following operation S120 (FIG. 2), in operation S131b, the memory controller 100 may refer to the N/O string information 122 and check a state of each of the memory blocks 210_1. In other words, the memory controller 100 may check the number of N/O strings included in each of the memory blocks 210_1 and may select a control scheme for operating each of the memory blocks 210_1. In operation S132b, the memory controller 100 may check whether the number of N/O strings included in each of the memory blocks 210_1 is equal to or greater than a second threshold value. In an example embodiment, the second threshold value may be one of various values set in advance. The second threshold value may be set to be equal to or different from the first threshold value in FIG. 3A. In some embodiments, the second threshold value may be set to '1', such that memory blocks including N/O strings and memory blocks including no N/O string may be controlled according to different control schemes.

When operation S132b is 'Yes', in operation S133b, the memory controller 100 may designate a memory block having a number of N/O strings equal to or greater than the second threshold value from among the memory blocks 210_1 as a first type of memory block ("first type memory block"). The first type memory block may refer to a memory block operated according to a control scheme considering a state of N/O strings that is not preferable in terms of data reliability. When operation S132b is 'No', in operation S134b, the memory controller 100 may designate a memory block having a number of N/O strings less than the second threshold value from among the memory blocks 210_1 as a second type of memory block ("second type memory block"). The second type memory block may refer to a memory block operated according to a control scheme considering that the second type memory block is capable of providing higher data reliability than the first type memory block. In operation S135b, the memory controller 100 may store designation information including results of designating the memory blocks 210_1 in operation S133b and operation S134b in the internal memory 120. In some embodiments, the designation information may be backed up in a region of the memory cell array 210 of the memory device 200, and, in this case, the memory controller 100 may request the designation information from the memory device 200 when the memory controller is powered on.

Figure 4A:
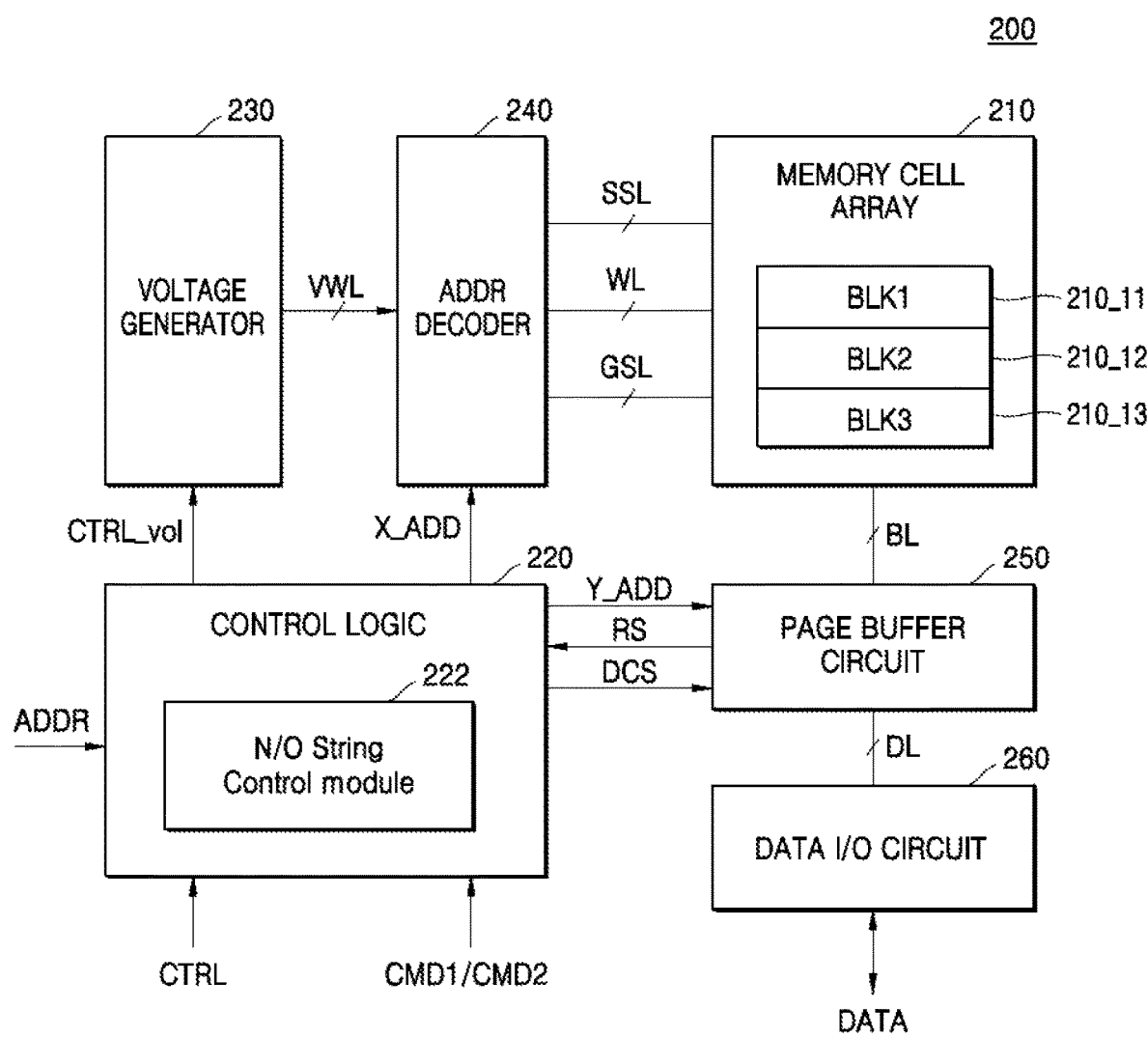

FIGS. 4A to 4C are diagrams for describing operations for a first type command and a second type command of FIG. 3A in detail. FIGS. 4A to 4C show example write/program operations in detail according to example embodiments of various control schemes.

Referring to FIG. 4A, the memory device 200 may include a memory cell array 210, a control logic 220, a voltage generator 230, an address decoder 240, a page buffer circuit 250, a control logic 230, and a data input/output circuit 260. Furthermore, the control logic 220 may include an N/O string control module 222 for performing a program operation according to an example embodiment of the inventive concept. Although not shown in FIG. 4A, the memory device 200 may further include various other function blocks related to memory operations. The N/O string control module 222 may be implemented as a hardware logic or may also be implemented as a software logic. Also, the N/O string control module 222 may be implemented to be included in a memory controller.

The memory cell array 110 may include a plurality of strings (or cell strings) arranged on a substrate in row and column directions. Each of the strings may include a plurality of memory cells stacked in a direction perpendicular to the substrate. In other words, memory cells may be stacked in a direction perpendicular to the substrate to form a 3D structure. Each of the memory cells may be used as a cell type like a single level cell, a multi level cell, a triple level cell, or a quad level cell. The inventive concept may be flexibly applied according to various cell types of the memory cells. In an example embodiment, the memory cell array 210 may include first to third memory blocks 210_11 to 210_13.

Referring to FIG. 4B, as shown in a first table TB1, the first to third memory blocks 210_11 to 210_13 may include 'A', 'B', and 'C' N/O strings, respectively. The memory controller may select and operate different types of control schemes respectively for the first to third memory blocks 210_11 to 210_13 based on N/O string information including the first table TB1.

The memory cells of the memory cell array 210 may be connected to word lines WL, string selection lines SSL, ground selection lines GSL, and bit lines BL. The memory cell array 210 may be connected to the address decoder 240 through the word lines WL, the string selection lines SSL, and the ground selection lines GSL and may be connected to the page buffer circuit 250 through the bit lines BL.

The page buffer circuit 250 may temporarily store data to be written into the memory cell array 210 and data read from the memory cell array 210. The page buffer circuit 250 may include a plurality of latch units (or page buffers). For example, each latch unit may include a plurality of latches corresponding to a plurality of bit lines BL and may store data page by page. In some embodiments, the page buffer circuit 250 may include a sensing latch unit, and the sensing latch unit may include a plurality of sensing latches corresponding to the bit lines BL. Also, each sensing latch may be connected to a sensing node by which data is sensed through a corresponding bit line.

The control logic 220 controls the overall operation of the memory device 200. For example, based on a command CMD, an address ADDR, and a control signal CTRL received from a memory controller (not shown), the control logic 220 may output various internal control signals for writing data to the memory cell array 210, reading data from the memory cell array 210, or erasing data stored in the memory cell array 210.

Various internal control signals output from the control logic 220 may be provided to the page buffer circuit 250, the voltage generator 230, and the address decoder 240. In detail, the control logic 220 may provide a voltage control signal CTRL_vol to the voltage generator 230. The voltage generator 230 may include one or more pumps (not shown), and the voltage generator 240 may generate voltages VWL having various levels according to a pumping operation based on the voltage control signal CTRL_vol. Meanwhile, the control logic 230 may provide a row address X_ADD to the address decoder 240 and may provide a column address Y_ADD to the page buffer circuit 250. Hereinafter, the operation of the N/O string control module 222 will be described. The control logic 220 may generate internal control signals corresponding to the operation of the N/O string control module 222 and output the internal control signals to function blocks of the memory device 200.

Although descriptions below will focus on performing a memory operation by memory blocks, it is merely an example, and the inventive concept is not limited thereto. Memory operations to which the inventive concept is applied may be performed by memory sub-blocks and various other memory groups.

The N/O string control module 222 according to an example embodiment of the inventive concept may receive a first type command CMD1 or a second type command CMD2 for a write operation of a target memory block from among the first to third memory blocks 210_11 to 210_13 from the memory controller. It will be assumed that, as described above with reference to FIG. 3A, the first type command CMD1 is generated to control a write operation for a target memory block including N/O strings of a number equal to or greater than the first threshold value and the second type command CMD2 is generated to control a write operation for a target memory block including N/O strings of a number less than the first threshold value.

The N/O string control module 222 may detect an N/O string from among a plurality of strings included in a target memory block of the memory cell array 110 in response to the first type command CMD1 received from a memory controller. For example, the N/O string control module 222 may detect an N/O string in a target memory block or a target memory sub-block of the memory cell array 210 corresponding to an address ADDR corresponding to the first type command CMD1. The N/O string control module 222 may provide internal control signals CTRL_vol, X_ADD, and Y_ADD to the voltage generator 230, the address decoder 240, and the page buffer circuit 250, respectively, to detect an N/O string.

For example, the N/O string control module 222 may apply a check voltage greater than a reference voltage to a plurality of word lines WL connected to a target memory block of the memory cell array 210 by using the voltage generator 230. The level of the check voltage may vary according to the cell type of the target memory block depending on whether an erase operation is primarily performed during a write operation or may be constant regardless of the cell type of the target memory block. The reference voltage may be a voltage for verifying the highest write state of memory cells or a voltage for verifying the erase state of the memory cells according to whether an erase operation for a target memory block or a target memory sub-block is primarily performed during a write operation.

When a check voltage is applied to the word lines WL connected to a target memory block, the page buffer circuit 250 may provide result signals RS output from the bit lines BL to the N/O string control module 222. The N/O string control module 222 may detect an N/O string from among a plurality of strings of a target memory block based on the result signals RS received from the page buffer circuit 250. For example, the N/O string control module 222 may identify a plurality of target memory cells turned off by a check voltage from among a plurality of memory cells of a target memory block based on the result signals RS, thereby detecting an N/O string including a plurality of target memory cells.

The N/O string control module 222 may convert a plurality of bits of target data previously intended to be written to a plurality of target memory cells included in a detected N/O string to have predetermined values. By writing such predetermined values in the target memory cells, the number of times for applying a write voltage to the plurality of target memory cells may be restricted. (Note that the original target data may be copied and then stored in a different memory location.) For example, the N/O string control module 222 may provide a data conversion signal DCS and column addresses Y_ADD corresponding to the target data to the page buffer circuit 250, thereby converting the target data latched to the page buffer circuit 250 into a predetermined value. Meanwhile, before the N/O string control module 222 converts values of the target data, data DATA to be written to the memory cell array 210 may be latched to the page buffer circuit 250 in advance through the data input/output circuit 260.

As the number of times a write voltage is applied through word lines to a plurality of target memory cells included in a N/O string increases, more severe stress may be applied to the N/O string, and thus, the N/O string may have a negative influence on neighboring strings or neighboring memory cells. Accordingly, the predetermined value may be a value pre-set to limit the number of times a write voltage is applied to target memory cells. For example, the predetermined value may be a value for forming a threshold voltage distribution corresponding to an erase state.

Note that the memory device 200, rather than converting the bits of the target data as described above, may refrain from writing the target data previously designated to be written to the target memory cells included in the detected N/O string and instead write data bits each having a predetermined value to the plurality of target memory cells. This may likewise restrict a number of times for applying a write voltage to the plurality of target memory cells.

The N/O string control module 222 may control the write operation, such that data including converted target data is written to the memory cell array 210 through the page buffer circuit 250. Through the operation of the N/O string control module 222, the number of times a write voltage is applied to word lines connected to a plurality of target memory cells of an N/O string may be limited and the stress of the N/O string may be reduced, thereby minimizing adverse effects of the N/O string.

Referring to FIG. 4C, the N/O string control module 222 may perform a series of programming sequences PS for detecting an N/O string of a target memory block of the memory cell array 210 in response to the first type command CMD1, converting target data corresponding to a detected N/O string by using the page buffer circuit 250, and writing data including converted target data to the memory cell array 210. Detailed descriptions thereof will be given below with reference to FIGS. 7 to 9.

The N/O string control module 222 may perform a general write operation in response to the second type write command CMD2 received from a memory controller. For example, the N/O string control module 222 may write data received from the data input/output circuit 260 to the memory cell array 210 in response to the second type write command CMD2.

The N/O string control module 222 according to an example embodiment of the inventive concept may receive a first type erase command CMD1 or a second type erase command CMD2 for an erase operation of a target memory block from among the first to third memory blocks 210_11 to 210_13 from the memory controller. It will be assumed that, as described above with reference to FIG. 3A, the first type erase command CMD1 is generated to control an erase operation for a target memory block including N/O strings of a number equal to or greater than the first threshold value and the second type erase command CMD2 is generated to control an erase operation for a target memory block including N/O strings of a number less than the first threshold value.

The N/O string control module 222 may perform an erase operation for a first time period by using an erase voltage of a first level to the target memory block of the memory cell array 210 in response to the first type erase command CMD1 received from the memory controller. The N/O string control module 222 may perform an erase operation for a second time period by using an erase voltage of a second level to the target memory block of the memory cell array 210 in response to the second type erase command CMD2 received from the memory controller. In an example embodiment, the first level may be higher than the second level, and the first time period may be shorter than the second time period. Detailed descriptions thereof will be given below with reference to FIGS. 10A to 10C.

Figure 5A:
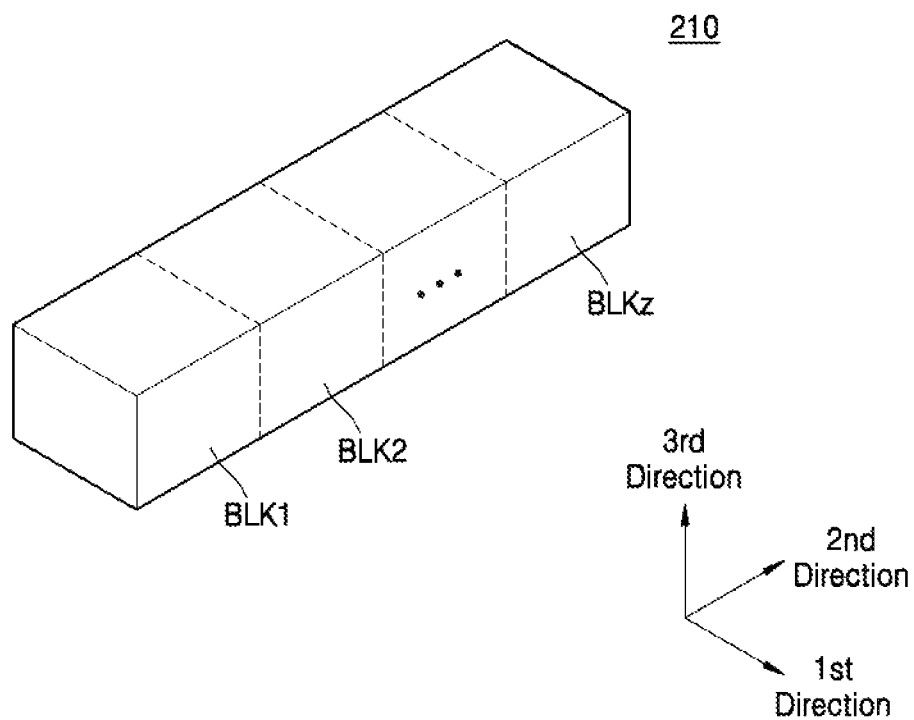
FIG. 5A is a block diagram showing the memory cell array of FIG. 1.
Figure 5B:
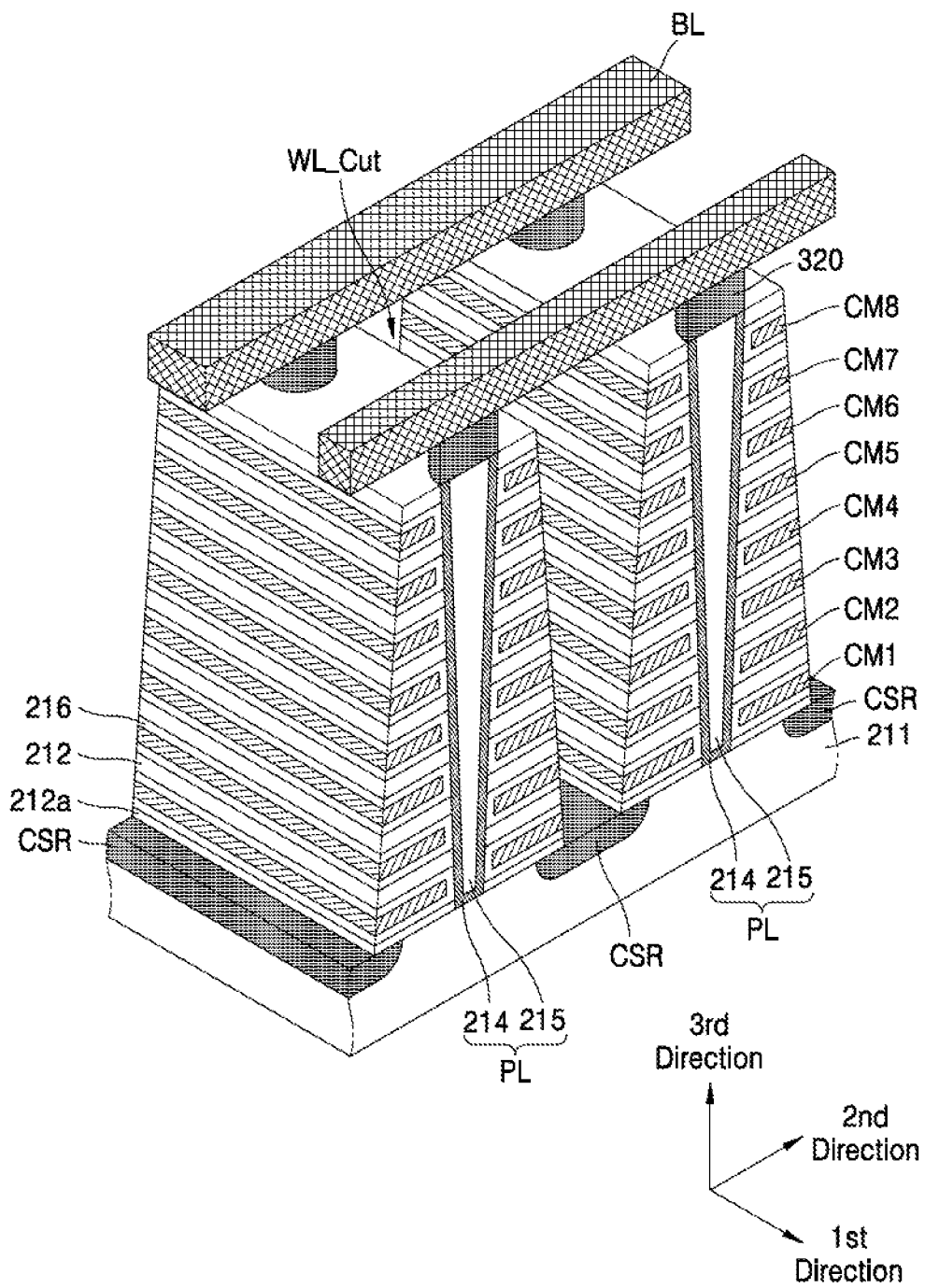
FIG. 5B is a perspective cross-sectional view of a first example of the memory cell array of FIG. 1.

FIG. 5A is a block diagram showing the memory cell array 210 of FIG. 1, FIG. 5B is a perspective cross-sectional view of a first example of the memory cell array 210 of FIG.

Figure 5C:
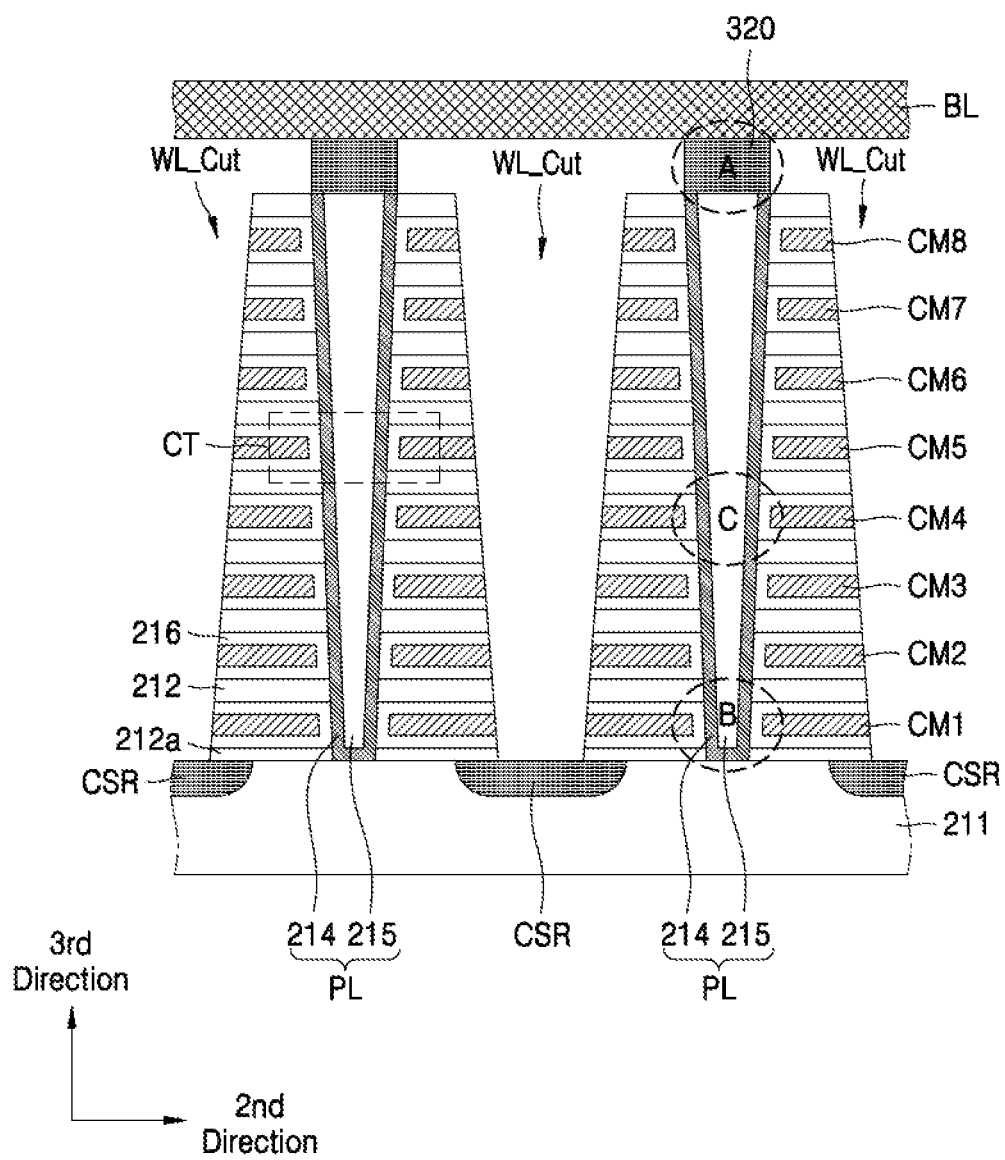
FIG. 5C is a perspective cross-sectional view of a second example of the memory cell array of FIG. 1.

1, and FIG. 5C is a perspective cross-sectional view of a second example of the memory cell array 210 of FIG. 1.

Referring to FIGS. 1 and 5A, the memory cell array 210 may include a plurality of memory blocks BLK1 to BLKz. The memory blocks BLK1 to BLKz may each have a 3D structure (a "vertical structure"). For example, the memory blocks BLK1 to BLKz may include structures extending in first to third directions, respectively. The memory blocks BLK1 to BLKz may each include a plurality of strings (not shown) extending in a second direction. The strings may be spaced apart from one another in the first and third directions. Strings (not shown) of one memory block may be connected to a plurality of bit lines BL, a plurality of string selection lines SSL, a plurality of word lines WL, a ground selection line GSL or a plurality of ground selection lines GSL, and a common source line (not shown). Strings (not shown) of the memory blocks BLK1 to BLKz may share the bit lines BL. For example, the bit lines BL may extend in the second direction and may be shared by the memory blocks BLK1 to BLKz.

The memory blocks BLK1 to BLKz may be selected by the address decoder 240 shown in FIG. 2. For example, the address decoder 240 may be configured to select a target memory block corresponding to a received address ADDR from among the memory blocks BLK1 to BLKz. A write operation, a read operation, and an erase operation may be performed on the selected target memory block.

Referring to FIGS. 5B and 5C, a substrate 211 is provided. For example, the substrate 211 may be a well having a first conductivity type. A plurality of common source regions CSR extending in the first direction and spaced apart from one another in the second direction may be provided on the substrate 211. The common source regions CSR may be connected to one another in common to form a common source line. The common source regions CSR have a second conductivity type different from that of the substrate 211.

Between two common source regions CSR adjacent to each other from among the common source regions CSR, a plurality of insulation materials 212 and 212a may be sequentially provided on the substrate 211 in the third direction (that is, a direction perpendicular to the substrate 211). The insulation materials 212 and 212a may be spaced apart from each other in the third direction. The insulation materials 212 and 212a may extend in the first direction.

Between two common source regions CSR adjacent to each other, a plurality of pillars PL sequentially arranged in the first direction and penetrating through the insulation materials 212 and 212a in the second direction may be provided. For example, the plurality of pillars PL may penetrate through the insulation materials 212 and 212a and contact the substrate 211. For example, between two common source regions CSR adjacent to each other, the pillars PL may be spaced apart from one another in the first direction. The pillars PL may be arranged along a row in the first direction.

For example, the pillars PL may include a plurality of materials. For example, the pillars PL may include channel films 214 and internal materials 215. The channel films 214 may include a semiconductor material (e.g., silicon) having the first conductivity type. The channel films 214 may include a semiconductor material (e.g., silicon) having the same conductivity type as that of the substrate 211. The channel films 214 may include an intrinsic semiconductor that does not have a conductivity type.

The internal materials 215 may include an insulation material. For example, the internal materials 215 may include an insulation material like a silicon oxide. For example, the internal materials 215 may include air gaps. Between two common source regions CSR adjacent to each other, information storage films 216 may be provided on exposed surfaces of the insulation materials 212 and 212a and the pillars PL. The information storage films 216 may store information by trapping or discharging electric charges.

Conductive materials CM1 to CM8 are provided on exposed surfaces of the information storage films 216 between two common source regions CSR adjacent to each other and between the insulation materials 212 and 212a. The conductive materials CM1 to CM8 may extend in the first direction. On the common source regions CSR, the conductive materials CM1 to CM8 may be separated by word line cuts WL cut. The word line cuts WL cut may expose the common source regions CSR. The word line cuts WL cut may extend in the first direction. For example, the conductive materials CM1 to CM8 may include a metallic conductive material. The conductive materials CM1 to CM8 may include a non-metallic conductive material like a polysilicon.

For example, the information storage films 216 provided on the top surface of the uppermost insulation material of the insulation materials 212 and 212a may be removed. For example, the information storage films 216 provided on side surfaces opposite to the pillars PL from among side surfaces of the insulation materials 212 and 212a may be removed.

A plurality of drains 320 may be provided on the pillars PL. For example, the drains 320 may include a semiconductor material (e.g., silicon) having the second conductivity type. For example, the drains 320 may include a semiconductor material (e.g., silicon) having an N conductivity type.

On the drains 320, the bit lines BL extending in the second direction and spaced apart from one another in the first direction may be provided. The bit lines BL are connected to the drains 320. For example, the drains 320 and the bit lines BL may be connected through contact plugs (not shown). For example, bit lines BL1 and BL2 may include metallic conductive materials. For example, the bit lines BL1 and BL2 may include non-metallic conductive materials like a polysilicon. The conductive materials CM1 to CM8 may have first to eighth heights in this order from the substrate 211, respectively.

The pillars PL may constitute a plurality of strings together with the information storage films 216 and the conductive materials CM1 to CM8. The pillars PL each constitute a string together with the information storage films 216 and adjacent conductive materials CM1 to CM8. On the substrate 211, the pillars PL may be provided in a row-wise direction and a column-wise direction. Eighth conductive materials CM8 may constitute rows. Pillars PL connected to the same eighth conductive material may constitute a row. The bit lines BL may constitute columns. Pillars PL connected to the same bit line may constitute a row. The pillars PL constitute a plurality of strings arranged in the row-wise direction and the column-wise direction, together with the information storage films 116 and the conductive materials CM1 to CM8. The strings may each include a plurality of cell transistors CT (or memory cells) stacked in a direction perpendicular to the substrate 211.

Referring to a portion A of FIG. 5C, a defect may occur at a pad between the drains 320 and a bit line BL during a manufacturing process, and thus, a corresponding string may not be electrically connected to the bit line BL.

Referring to a portion B of FIG. 5C, due to a defect in a manufacturing process, a hole(s) in which the pillars PL are to be formed may not reach the substrate 211. In other words, the hole(s) in which the pillars PL are to be formed may not be formed deep enough, and, in this case, the channel films 214 may not contact the substrate 211. In detail, due to an etching failure during a process for forming a pillar PL, the pillar PL may not be connected to a ground select transistor.

Referring to a portion C of FIG. 5C, when forming a channel of a memory cell, a defect may occur due to a failure of etching or deposition.

Because a channel is not formed due to the defects in portions A to C of FIG. 5C, the corresponding string may correspond to an N/O string, and memory cells included in the N/O string may always be read as an OFF state during a read operation regardless of data written thereto.

Figure 6:
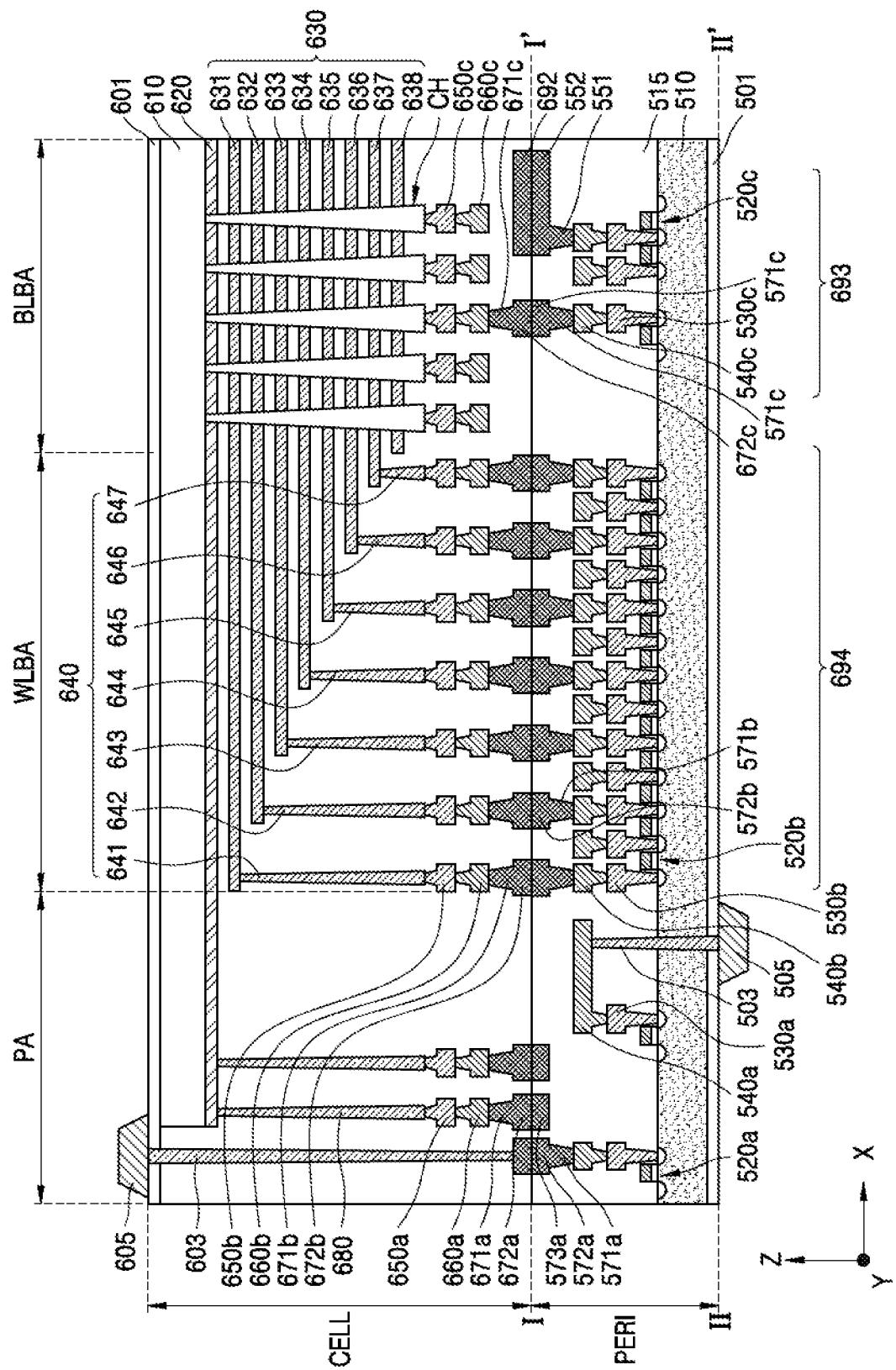
FIG. 6 is a diagram for describing a chip to chip (C2C) structure applied to a memory device according to an example embodiment of the inventive concept.

FIG. 6 is a diagram for describing a chip to chip (C2C) structure applied to a memory device 400 (an example of the memory device 200) according to an example embodiment of the inventive concept.

Referring to FIG. 6, the memory device 400 may have a C2C structure. The C2C structure may refer to a structure formed by fabricating an upper chip including a cell region CELL on a first wafer, fabricating a lower chip including a peripheral circuit region PERI on a second wafer different from the first wafer, and connecting the upper chip and the lower chip to each other through bonding. For example, the bonding may refer to an electric connection between a bonding metal formed on an uppermost metal layer of the upper chip and a bonding metal formed on an uppermost metal layer of the lower chip. For example, when the bonding metal includes copper (Cu), the bonding may be a Cu—Cu bonding, and the bonding metal may also include aluminum or tungsten.

The peripheral circuit region PERI and the cell region CELL of the memory device 400 may each include an external pad bonding area PA, a word line bonding area WLBA, and a bit line bonding area BLBA.

The peripheral circuit region PERI may include a first substrate 510, an interlayer insulation layer 515, a plurality of circuit elements 520a, 520b, and 520c formed on the first substrate 510, first metal layers 530a, 530b, and 530c respectively connected to the circuit elements 520a, 520b, and 520c, and second metal layers 540a, 540b, and 540c respectively formed on the first metal layers 530a, 530b, and 530c. In an embodiment, the first metal layers 530a, 530b, and 530c may include tungsten having relatively high resistance, whereas the second metal layers 540a, 540b, 540c may include copper having relatively low resistance.

Although only the first metal layers 530a, 530b, and 530c and the second metal layers 540a, 540b, and 540c are shown and described in the present specification, the inventive concept is not limited thereto, and one or more metal layers may be further formed on the second metal layers 540a, 540b, and 540c. At least some of the one or more metal layers formed on the second metal layers 540a, 540b, and 540c may include a material like aluminum having a lower resistance than copper constituting the second metal layers 540a, 540b, and 540c.

The interlayer insulation layer 515 is provided on the first substrate 510 to cover the circuit elements 520a, 520b, and 520c, the first metal layers 530a, 530b, and 530c, and the second metal layers 540a, 540b, and 540c and may include an insulation material like a silicon oxide or a silicon nitride.

Lower bonding metals 571b and 572b may be formed on the second metal layer 540b in the word line bonding area WLBA. In the word line bonding area WLBA, the lower bonding metals 571b and 572b in the peripheral circuit region PERI may be electrically connected upper bonding metals 671b and 672b in the cell region CELL through bonding, wherein the lower bonding metals 571b and 572b and the upper bonding metals 671b and 672b may include aluminum, copper, or tungsten.

The cell region CELL may provide at least one memory block. The cell region CELL may include a second substrate 610 and a common source line 620. On the second substrate 610, a plurality of word lines 631 to 638 (hereinafter, collectively 630) may be stacked in a direction perpendicular to the top surface of the second substrate 610 (Z-axis direction). String selection lines and a ground selection line may be arranged on the top and bottom of the word lines 630, and the word lines 630 may be arranged between the string selection lines and the ground selection line.

In the bit line bonding area BLBA, a channel structure CH may extend in a direction perpendicular to the top surface of the second substrate 610 and penetrate through the word lines 630, the string selection lines, and the ground selection line. The channel structure CH may include a data storage layer, a channel layer, and a buried insulation layer, and the channel layer may be electrically connected to a first metal layer 650c and a second metal layer 660c. For example, the first metal layer 650c may be a bit line contact, and the second metal layer 660c may be a bit line. In an embodiment, the bit line 660c may extend in a first direction parallel to the top surface of the second substrate 610 (Y-axis direction).

In the embodiment shown in FIG. 6, a region in which the channel structure CH and the bit line 660c are arranged may be defined as the bit line bonding area BLBA. The bit line 660c may be electrically connected to circuit elements 520c, which provide a page buffer 693 in the peripheral circuit region PERI, in the bit line bonding area BLBA. For example, the bit line 660c is connected to upper bonding metals 671c and 672c in the peripheral circuit region PERI, and the upper bonding metals 671c and 672c may be connected to lower bonding metals 571c and 572c that are connected to the circuit elements 520c of the page buffer 693.

In the word line bonding area WLBA, the word lines 630 may extend in a second direction parallel to the top surface of the second substrate 610 (X-axis direction) and may be connected to a plurality of cell contact plugs 641 to 647 (hereinafter collectively 640). The word lines 630 and the cell contact plugs 640 may be connected to each other at pads provided by at least some of the word lines 630 extending to different lengths in the second direction. A first metal layer 650b and a second metal layer 660b may be sequentially connected to the top of the cell contact plugs 640 connected to the word lines 630. In the word line bonding area WLBA, the cell contact plugs 640 may be connected to the peripheral circuit region PERI through the upper bonding metals 671b and 672b in the cell region CELL and the lower bonding metals 571b and 572b in the peripheral circuit region PERI.

The cell contact plugs 640 may be electrically connected to the circuit elements 520b that provide a row decoder 694 in the peripheral circuit region PERI. In an embodiment, an operating voltage of the circuit elements 520b providing the row decoder 694 may be different from an operating voltage of the circuit elements 520c providing the page buffer 693. For example, the operating voltage of the circuit elements 520c providing the page buffer 693 may be greater than the operating voltage of the circuit elements 520b providing the row decoder 694.

A common source line contact plug 680 may be provided in the external pad bonding area PA. The common source line contact plug 680 may include a conductive material like a metal, a metal compound, or polysilicon and may be electrically connected to the common source line 620. A first metal layer 650a and a second metal layer 660a may be sequentially stacked on the common source line contact plug 680. For example, an area in which the common source line contact plug 680, the first metal layer 650a, and the second metal layer 660a are arranged may be defined as the external pad bonding area PA.

Meanwhile, input/output pads 505 and 605 may be arranged in the external pad bonding area PA. A lower insulation film 501 covering the bottom surface of the first substrate 510 may be formed under the first substrate 510, and the first input/output pad 505 may be formed on the lower insulation film 501. The first input/output pad 505 is connected to at least one of the circuit elements 520a, 520b, and 520c arranged in the peripheral circuit region PERI through a first input/output contact plug 503 and may be separated from the first substrate 510 by the lower insulation film 501. Also, a side insulation film may be provided between the first input/output contact plug 503 and the first substrate 510 to electrically separate the first input/output contact plug 503 from the first substrate 510.

An upper insulation film 601 covering the top surface of the second substrate 610 may be formed on the second substrate 610, and a second input/output pad 605 may be provided on the upper insulation film 601. The second input/output pad 605 may be connected to at least one of the circuit elements 520a, 520b, and 520c arranged in the peripheral circuit region PERI through a second input/output contact plug 603.

According to embodiments, the second substrate 610 and the common source line 620 may not be arranged in an area where the second input/output contact plug 603 is provided. Also, the second input/output pad 605 may not overlap the word lines 630 in the third direction (Z-axis direction). The second input/output contact plug 603 is separated from the second substrate 610 in a direction parallel to the top surface of the second substrate 610 and may penetrate through the interlayer insulation layer 615 in the cell region CELL and be connected to the second input/output pad 605.

According to embodiments, the first input/output pad 505 and the second input/output pad 605 may be selectively formed. For example, the memory device 400 may include only the first input/output pad 505 provided on the first substrate 501 or only the second input/output pad 605 provided on the second substrate 601. Alternatively, the memory device 400 may include both the first input/output pad 505 and the second input/output pad 605.

In each of the external pad bonding area PA and the bit line bonding area BLBA included in each of the cell region CELL and the peripheral circuit region PERI, a metal pattern of an uppermost metal layer may be a dummy pattern or the uppermost metal layer may be omitted.

In the memory device 400, in the external pad bonding area PA, in correspondence to an upper metal pattern 672a formed on the uppermost metal layer in the cell region CELL, a lower metal pattern 573a having the same shape as the upper metal pattern 672a in the cell region CELL may be formed on the uppermost metal layer in the peripheral circuit region PERI. The lower metal pattern 573a formed on the uppermost metal layer in the peripheral circuit region PERI may not be connected to a separate contact in the peripheral circuit region PERI. Similarly, in the external pad bonding area PA, in correspondence to a lower metal pattern formed on the uppermost metal layer in the peripheral circuit region PERI, an upper metal pattern having the same shape as the lower metal pattern in the peripheral circuit region PERI may be formed on the uppermost metal layer in the cell region CELL.

The lower bonding metals 571b and 572b may be formed on the second metal layer 540b in the word line bonding area WLBA. In the word line bonding area WLBA, the lower bonding metals 571b and 572b in the peripheral circuit region PERI may be electrically connected to the upper bonding metals 671b and 672b in the cell region CELL through bonding.

Also, in the bit line bonding area BLBA, in correspondence to a lower metal pattern 552 formed on the uppermost metal layer in the peripheral circuit region PERI, an upper metal pattern 692 having the same shape as the metal pattern 552 may be formed on the uppermost metal layer in the cell region CELL. A contact may not be formed on the upper metal pattern 692 formed on the uppermost metal layer in the cell region CELL.

Figure 7:
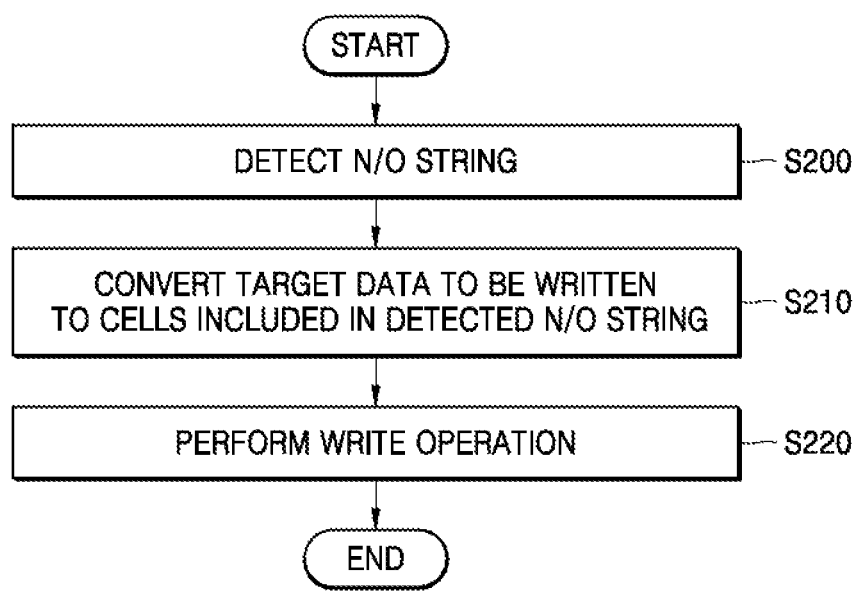
FIG. 7 is a flowchart for describing an operation of a memory device in response to a first type command of FIG. 4A in detail.

FIG. 7 is a flowchart for describing an operation of a memory device in response to the first type command CMD1 of FIG. 4A in detail.

Referring to FIG. 7, in operation S200, a memory device may detect an N/O string from among a plurality of strings of a target memory block intended to be written to in response to a first type command. In operation S210, the memory device may convert target data to be written to cells included in the detected N/O string to have a predetermined value. In operation S220, the memory device may perform an operation for writing data including the converted target data to a memory cell array. Meanwhile, although there is one N/O string in the description for convenience of explanation, the inventive concept is not limited thereto. There may be a plurality of N/O strings, and the inventive concept may be applied to a write operation for a plurality of N/O strings. Also, a write operation for a memory device according to example embodiments of the inventive concept may be performed by memory sub-blocks or by predetermined memory groups.

Figure 8A:
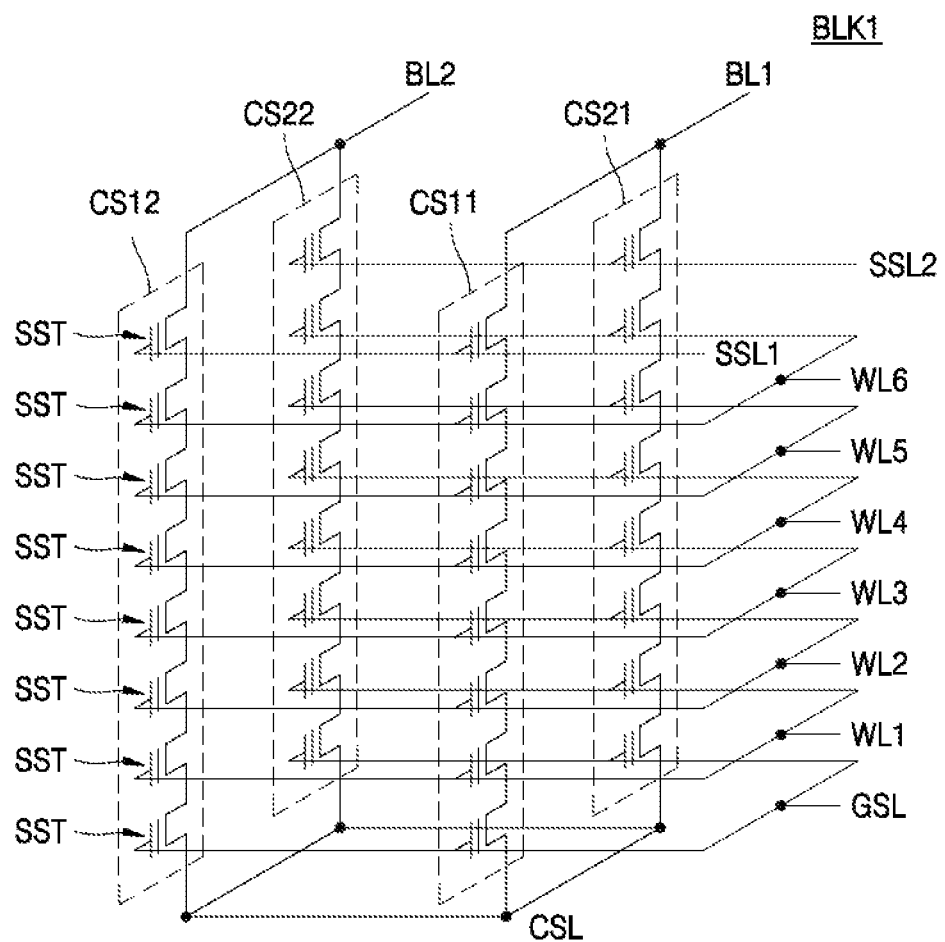
Figure 8C:
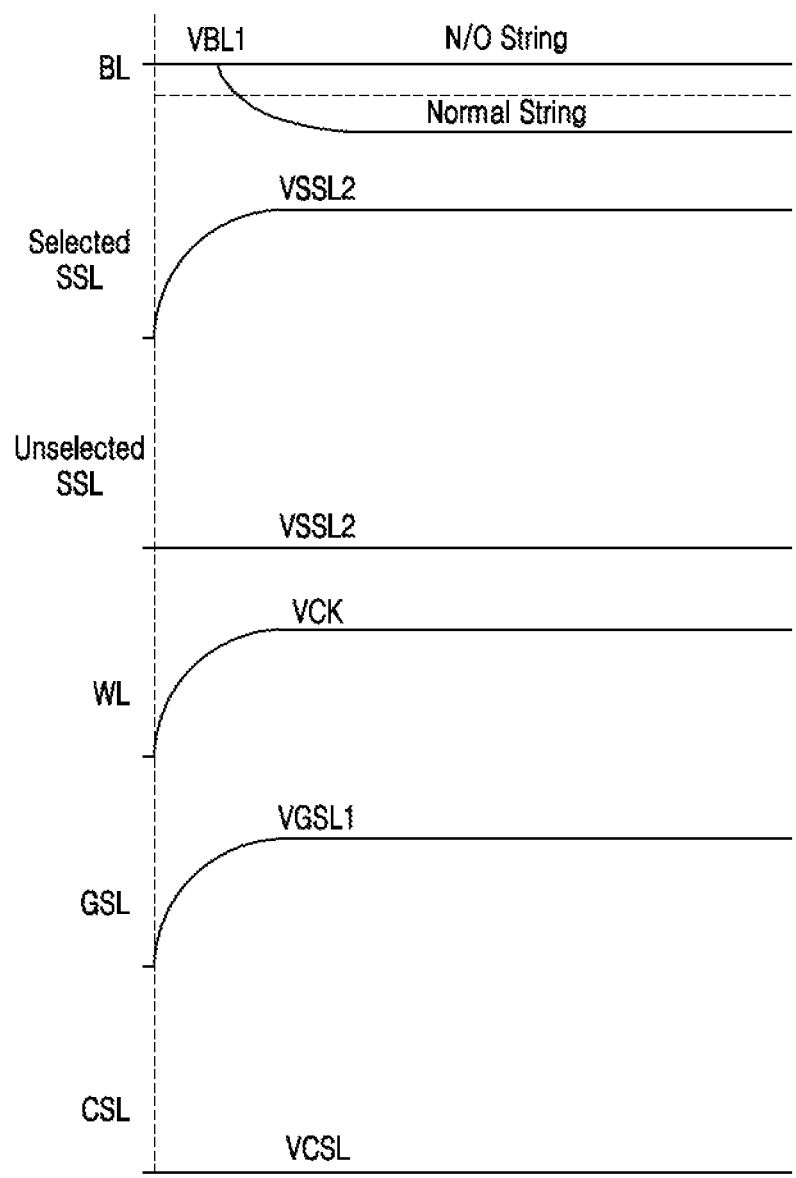

FIGS. 8A to 8C are diagrams for describing a method of operating a memory device in response to the first type command CMD1 of FIG. 4A.

FIG. 8A is an equivalent circuit diagram of the first memory block BLK1 of FIG. 5A. Referring to FIG. 8A, cell strings CS11, CS12, CS21, and CS22 may be located between bit lines BL1 and BL2 and a common source line CSL. Cell strings CS11 and CS21 may be connected between a first bit line BL1 and the common source line CSL. Cell strings CS12 and CS22 may be connected between a second bit line BL2 and the common source line CSL. The common source regions (CSR of FIG. 3B) may be connected to one another in common to form the common source line CSL.

Memory cells of the same height are commonly connected to one word line, and, when a voltage is supplied to a word line of a particular height, the voltage may be supplied to all of the strings CS11, CS12, CS21, and CS22. Strings of different rows may be connected to different string selection lines SSL1 and SSL2, respectively. By selecting and unselecting first and second string selection lines SSL1 and SSL2, the strings CS11, CS12, CS21, and CS22 may be selected and unselected by rows. For example, strings CS11 and CS12 or strings CS21 and CS22 connected to an unselected string selection line SSL1 or SSL2 may be electrically separated from the bit lines BL1 and BL2. Strings CS21 and CS22 or CS11 and CS12 connected to a selected string selection line SSL2 or SSL1 may be electrically connected to the bit lines BL1 and BL2.

The strings CS11, CS12, CS21, and CS22 may be connected to the bit lines BL1 and BL2 by columns. Strings CS11 and CS21 may be connected to the first bit line BL1, and strings CS12 and CS22 may be connected to the second bit line BL2. By selecting and unselecting the bit lines BL1 and BL2, the strings CS11, CS12, CS21, and CS22 may be selected and unselected by columns. Hereinafter, a write operation according to an example embodiment of the inventive concept will be described by focusing on the structure of the first memory block BLK1 shown in FIG. 6A. However, this is merely an example embodiment; the inventive concept may be applied to the memory block BLK1 having a different structure.

Turning to FIG. 8B, the memory device may apply a first bit line voltage VBL1 to the bit lines BL1 and BL2 in operation DT STEP for detecting an N/O string from among the strings CS11, CS12, CS21, and CS22 in response to a first type command, apply a first string selection line voltage VSSL1 (or a turn-on voltage) to a string selection line selected from between string selection lines SSL1 and SSL2, apply a second string selection line voltage VSSL2 (or a turn-off voltage) to an unselected string selection line, sequentially apply a check voltage VCK to word lines WL1 to WL6, apply a first ground selection line voltage VGSL1 to the ground selection line GSL, apply a first common source line voltage VCSL1 to the common source line CSL, and apply a ground voltage VSS to the substrate.

For example, the first bit line voltage VBL1 may be a power voltage VCC, the first string selection line voltage VSSL1 may be the power voltage VCC, and the second string selection line voltage VSSL2 may be the ground voltage VSS or a low voltage having a level similar thereto. As described above, the check voltage VCK may have a level higher than the level of a predetermined reference voltage.

Referring to FIG. 8C, the voltages described above with reference to FIG. 8B may be applied to the bit line BL, the selected string selection line Selected SSL, the unselected string selection line Unselected SSL, the selected word line WL, the ground selection line GSL, and the common source line CSL at the beginning of operation DT STEP. For example, the voltage of the bit line BL connected to a general string may become lower than the predetermined reference voltage at the first bit line voltage VBL1, and the voltage of the bit line BL connected to an N/O string may be maintained at the first bit line voltage VBL1. Therefore, the memory device may detect an N/O string.

Figure 9:
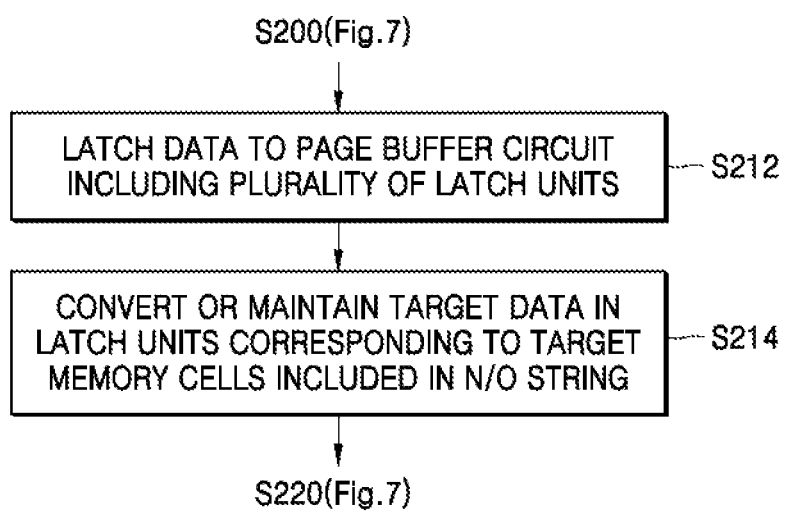
FIG. 9 is a flowchart for describing operation S210 of FIG. 7 in detail.

FIG. 9 is a flowchart for describing operation S210 of FIG. 7 in detail.

Referring to FIG. 9, in operation S212, the memory device may pre-latch data to be written to a memory cell array to a page buffer circuit including a plurality of latch units. The data may be data encoded by a memory controller. For example, the memory controller may encode data received from a host into an error correction codeword and provide the same to the memory device. In operation S214, target data latched to latch units corresponding to target memory cells included in an N/O string may be converted or maintained to have a predetermined value each. In an example embodiment, the predetermined value may be pre-set as a value corresponding to inhibit data for forming a threshold voltage distribution in an erase state.

Figure 10B:
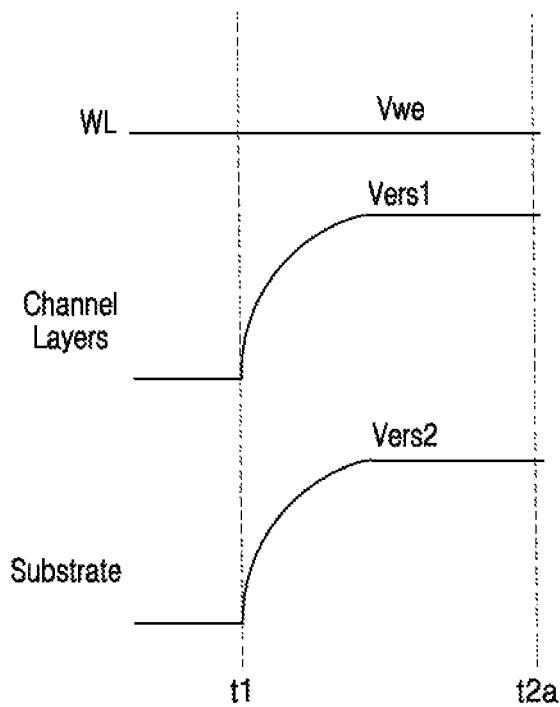
Figure 10C:
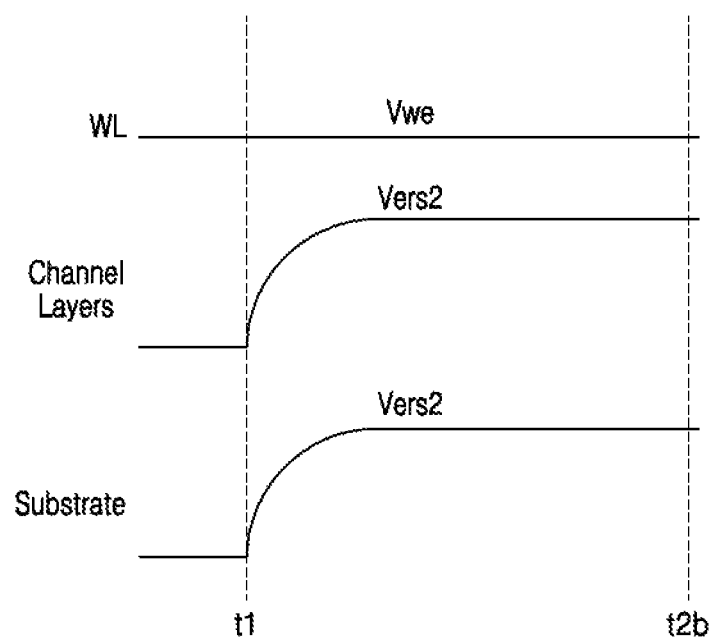

FIGS. 10A to 10C are diagrams for describing a method of operating a memory device in response to first and second type erase commands CMD1 and CMD2 of FIG. 4A.

Referring to FIG. 10A, a memory device may perform an erase operation E STEP for erasing a target memory block in response to a first type erase command or a second type erase command. In an example embodiment, the memory device may float the bit lines BL1 and BL2 and the common source line CSL in operation E STEP, and the string selection lines SSL1 and SSL2 may be floated or supply a third string selection line voltage VSSL3. The memory device may supply a word line erase voltage Vwe to the word lines WL1 to WL6. The word line erase voltage Vwe may be the ground voltage VSS or a low voltage (including a positive voltage and a negative voltage) having a level similar to that of the ground voltage VSS. Also, the memory device may float the ground selection line GSL, or supply a second ground selection line voltage VGSL2, and supply a first erase voltage Vers1 or a second erase voltage Vers2 to the substrate 211 (FIG. 5B). The first erase voltage Vers1 may correspond to the first type erase command, and the second erase voltage Vers2 may correspond to the second type erase command.

Turning to FIG. 10B, the channel films 214 (FIG. 5B) may be charged to the level of the first erase voltage Vers1 by the first erase voltage Vers1 supplied to the substrate 211 (FIG. 5B) during a first time period t1 in response to the first type erase command. Due to a voltage difference between the word line erase voltage Vwe supplied to the word lines WL1 to WL6 and the first erase voltage Vers1 of the channel films 214 (FIG. 5B), charges trapped in memory cells MC1 to MC6 leak out, and thus erasing may occur. The erase operation may be performed until a second time period t2a.

Referring to FIG. 10C, the channel films 214 (FIG. 5B) may be charged to the level of the second erase voltage Vers2 by the second erase voltage Vers2 supplied to the substrate 211 (FIG. 5B) during the first time period t1 in response to the second type erase command. Due to a voltage difference between the word line erase voltage Vwe supplied to the word lines WL1 to WL6 and the second erase voltage Vers2 of the channel films 214 (FIG. 5B), charges trapped in memory cells MC1 to MC6 leak out, and thus erasing may occur. The erase operation may be performed until a third time period t2b.

In an example embodiment, the first erase voltage Vers1 may have a higher level than the second erase voltage Vers2, and the time period between the first time period t1 and the second time period t2a may be shorter than the time period between the first time period t1 and the third time period t2b.

In other words, data reliability supported by a target memory block having the number of N/O strings equal to or greater than the first threshold value may be slightly low. Therefore, the target memory block may be operated to ensure guaranteed data reliability even when an erase operation is performed for a time period shorter than a general time period by using an erase voltage having a level higher than a general erase voltage. Therefore, a quick erase operation for a target memory block is possible, thereby improving the performance of the overall memory device. Meanwhile, by performing a general erase operation on a target memory block corresponding to the number of N/O strings less than the first threshold value, the target memory block may be operated to ensure high data reliability.

Figure 11B:
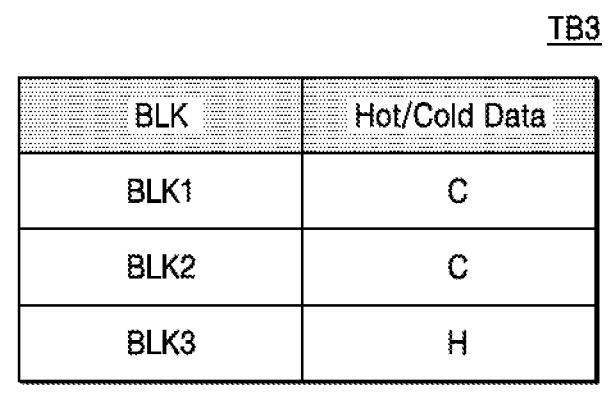

FIGS. 11A and 11B are diagrams for describing the first and second type memory blocks of FIG. 3B in detail. Hereinafter, it is assumed that a memory controller designates first and second memory blocks BLK1 and BLK2 each corresponding to the number of N/O strings equal to or greater than the second threshold value as a first type memory block and designates a third memory block BLK3 corresponding to the number of N/O strings less than the second threshold value as a second type memory block.

Referring to FIG. 11A, as shown in a second table TB2, the memory controller may operate memory cells of the first and second memory blocks BLK1 and BLK2 as a triple level cell (TLC). Also, the memory controller may operate memory cells of the third memory block BLK3 as a single level cell (SLC). In other words, because data reliability supported by a first type memory block corresponding to the number of N/O strings equal to or greater than the second threshold value may be relatively low, the first type memory block may be operated as a high-level cell. Conversely, because data reliability supported by a second type memory block corresponding to the number of N/O strings less than the second threshold value may be relatively high, the second type memory block may be operated as a low-level cell.

In other embodiments, the first and second memory blocks BLK1 and BLK2 are operated as a multi-level cell or a quad-level cell. Furthermore, in other embodiments the first type memory block may be operated as a low-level cell, and the second type memory block may be operated as a higher-level cell than the first type memory block.

Referring still to FIG. 11B, as shown in a third table TB3, the memory controller may operate the first and second memory blocks BLK1 and BLK2 exclusively to write cold data thereto. Also, the memory controller may operate the third memory block BLK3 exclusively to write hot data thereto. In other words, because data reliability supported by a first type memory block corresponding to the number of N/O strings equal to or greater than the second threshold value may be relatively low, the first type memory block may be operated to be exclusively written to with cold data that is accessed less frequently than a reference frequency. Because data reliability supported by a second type memory block corresponding to the number of N/O strings less than the second threshold value may be relatively high, the second type memory block may be operated to be exclusively written to with hot data that is accessed more frequently than the reference frequency.

Figure 12B:
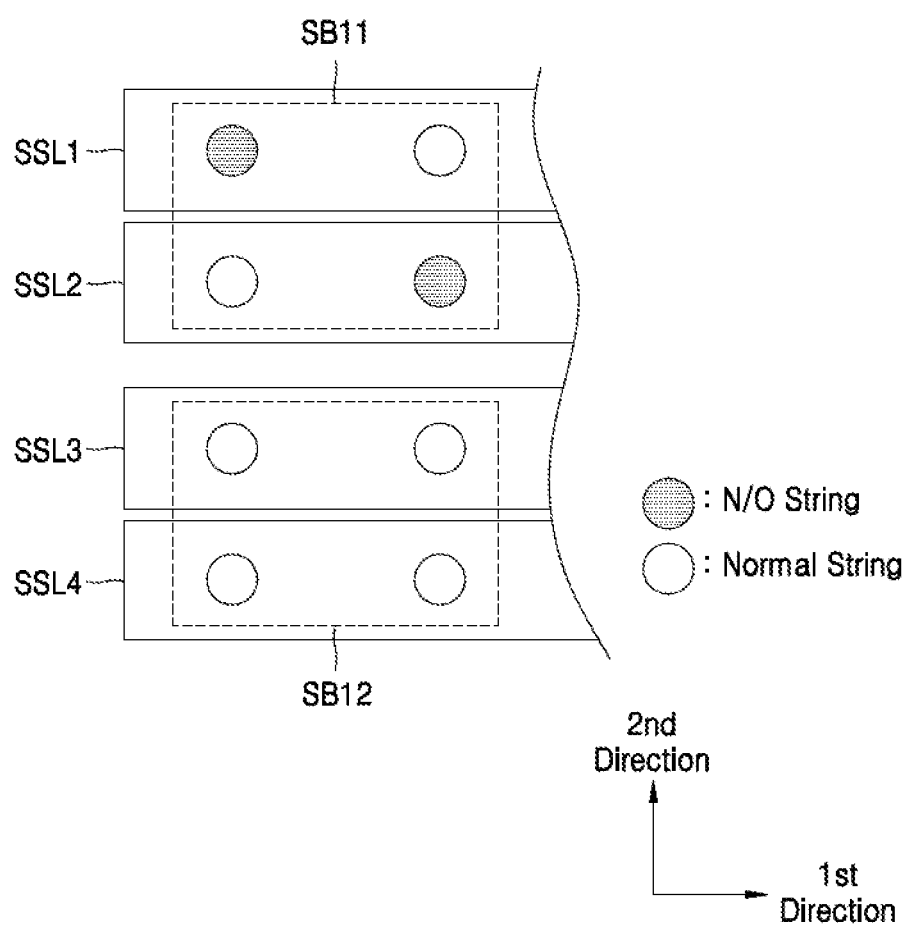
Figure 12C:
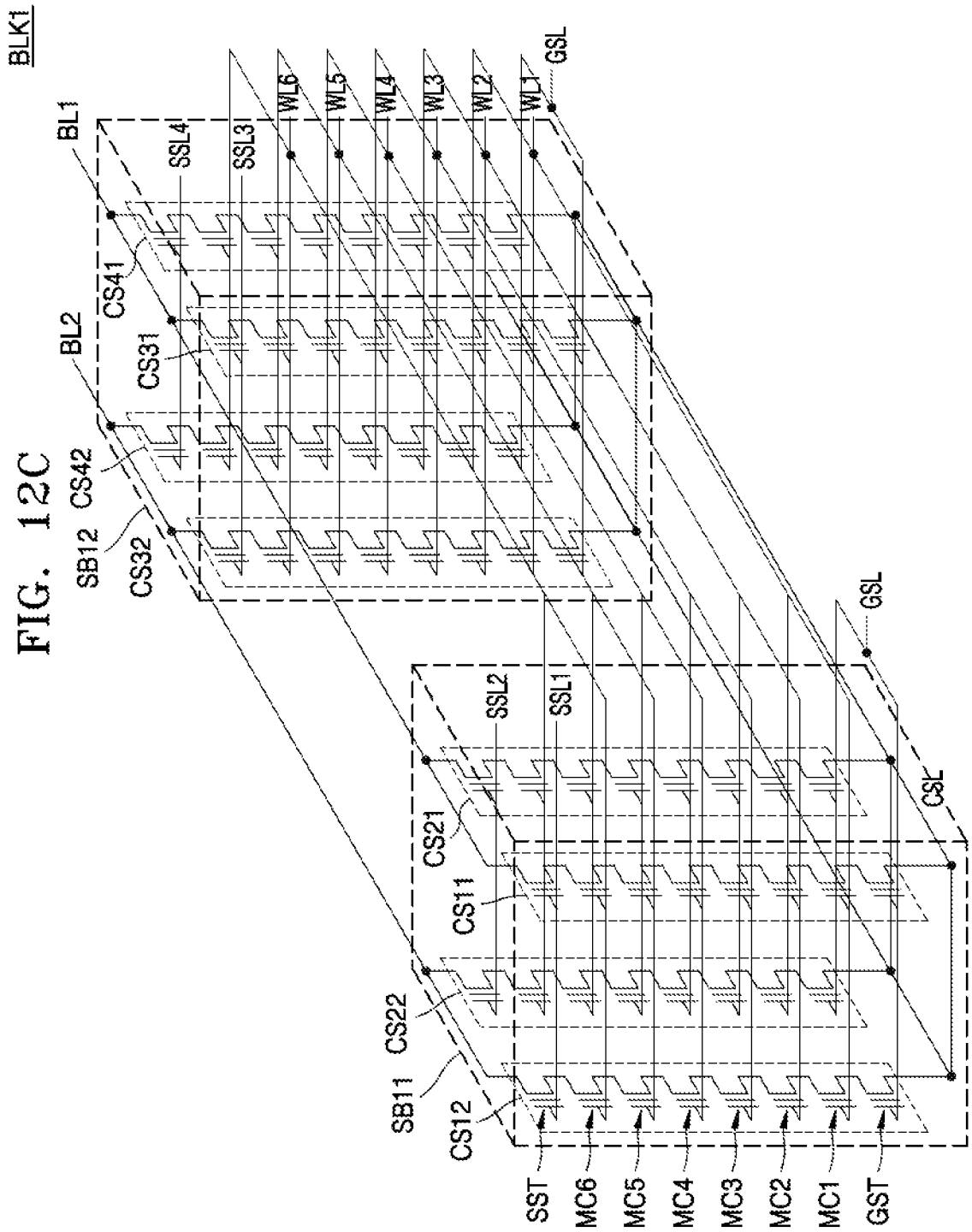

FIGS. 12A to 12C are diagrams for describing in detail an embodiment of executing a selected control scheme for each of a plurality of sub-blocks included in a memory block.

Referring to FIG. 12A, as shown in a fourth table TB4, the first memory block BLK1 may include first and second sub-blocks SB11 and SB12, the second memory block BLK2 may include third and fourth sub-blocks SB21 and SB22, and the third memory block BLK3 may include fifth and sixth sub-blocks SB31 and SB32. First to sixth sub-blocks SB11, SB12, SB21, SB22, SB31, and SB32 may include 'A1', 'A2', 'B1', 'B2', 'C1', and 'C2' N/O strings, respectively. The memory controller may select and operate different types of control schemes respectively for the first to sixth sub-blocks SB11, SB12, SB21, SB22, SB31, and SB32 based on N/O string information including the fourth table TB4. In an example embodiment, the N/O string information including the fourth table TB4 may be generated in advance and may be stored in a memory cell array of a memory device.

FIG. 12B is a diagram for describing in detail the structures of the first and second sub-blocks SB11 and SB12 of the first memory block BLK1. Referring to FIG. 12B, a first sub-block SB11 may include memory cells of strings connected to first and second string selection lines SSL1 and SSL2, and a second sub-block SB12 may include memory cells of strings connected to third and fourth string selection lines SSL3 and SSL4.

The first and second string selection lines SSL1 and SSL2 are each connected to at least one N/O string, and the first sub-block SB11 may include N/O strings of the number equal to or greater than a predetermined threshold value. Therefore, the first sub-block SB11 may be controlled by the first type command of FIG. 3A or may be designated as a first type sub-block operated in the same manner as the first type memory block of FIG. 3B. The third and fourth string selection lines SSL3 and SSL4 are connected only to general strings, and the second sub-block SB12 may include N/O strings of the number less than the predetermined threshold value. Therefore, the second sub-block SB12 may be controlled by the second type command of FIG. 3A or may be designated as a second type sub-block operated in the same manner as the second type memory block of FIG. 3B.

In other words, sub-blocks may be grouped according to string selection lines, and the string selection lines corresponding to the sub-blocks may be adjacent to or separated from each other.

FIG. 12C is a diagram showing the circuit structure of the first and second sub-blocks SB11 and SB12 of the first memory block BLK1 in detail. Referring to FIG. 12C, the first sub-block SB11 may include memory cells MC1 to MC6 of first to fourth strings CS11, CS12, CS21, and CS22 connected to the first and second string selection lines SSL1 and SSL2. The second sub-block SB12 may include memory cells MC1 to MC6 of fifth to eighth strings CS31, CS32, CS41, and CS42 connected to the third and fourth string selection lines SSL3 and SSL4.

Figure 13:
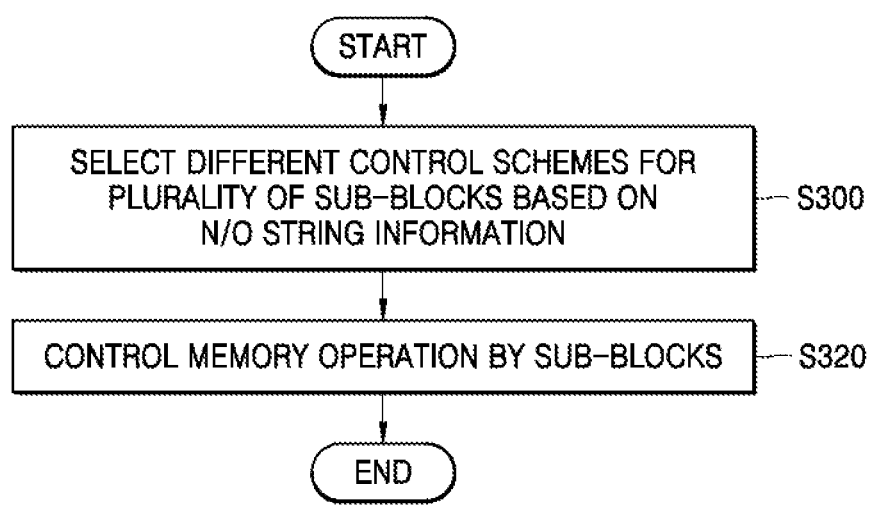
FIG. 13 is a flowchart of a method of operating a memory controller according to an example embodiment of the inventive concept.

FIG. 13 is a flowchart of a method of operating a memory controller according to an example embodiment of the inventive concept.

Referring to FIG. 13, in operation S300, a memory controller may select a control scheme for each of a plurality of sub-blocks based on N/O string information. In operation S320, the memory controller may control the memory operation of a memory device by sub-blocks based on a selected control scheme.

Figure 14:
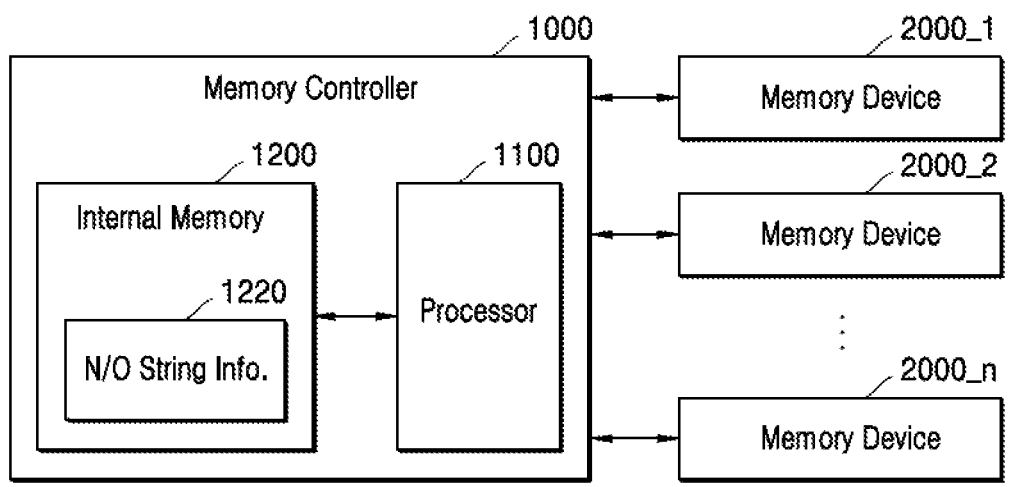
FIG. 14 is a block diagram showing a memory system according to an example embodiment of the inventive concept.

FIG. 14 is a block diagram showing a memory system 20 according to an example embodiment of the inventive concept, and FIG. 15 is a table showing an example of N/O string information 1220 of FIG. 14.

Referring to FIG. 14, the memory system 20 may include a memory controller 1000 and first to n-th memory devices 2000_1 to 2000_n. The memory controller 1000 may include a processor 1100 and an internal memory 1200. The internal memory 1200 may include the N/O string information 1220. The N/O string information 1220 may include information indicating the number of N/O strings included in memory blocks of each of the first to n-th memory devices 2000_1 to 2000_n. The processor 1100 may select and operate a control scheme for each of the memory blocks of the first to n-th memory devices 2000_1 to 2000_n based on the N/O string information 1220.

As shown in FIG. 15, as shown in a fifth table TB5, the N/O string information 1220 may include information indicating the number of N/O strings included in memory blocks BLK11 to BLK13, BLK21 to BLK23, and BLK31 to BLK33 of first to third memory devices 2000_1 to 2000_3. First to third memory blocks BLK11 to BLK13 may include 'A1', 'B1', and 'C1' N/O strings, respectively. Fourth to sixth memory blocks BLK21 to BLK23 may include 'A2', 'B2', and 'C2' N/O strings, respectively. Seventh to ninth memory blocks BLK31 to BLK33 may include 'A3', 'B3', and 'C3' N/O strings, respectively. Although it is illustrated that the fifth table TB5 includes N/O string information regarding the first to third memory devices 2000_1 to 2000_3 for convenience of explanation, the fifth table TB5 may further include N/O string information regarding other memory devices 2000_4 to 2000_n.

The processor 1100 may select and operate any one of different control schemes for each of the memory blocks BLK11 to BLK13, BLK21 to BLK23, and BLK31 to BLK33 of the first to third memory devices 2000_1 to 2000_3 based on the fifth table TB5. Hereinafter, an embodiment in which the processor 1100 performs a control operation, to which example embodiments of the inventive concept are applied, by memory devices will be described.

Figure 16:
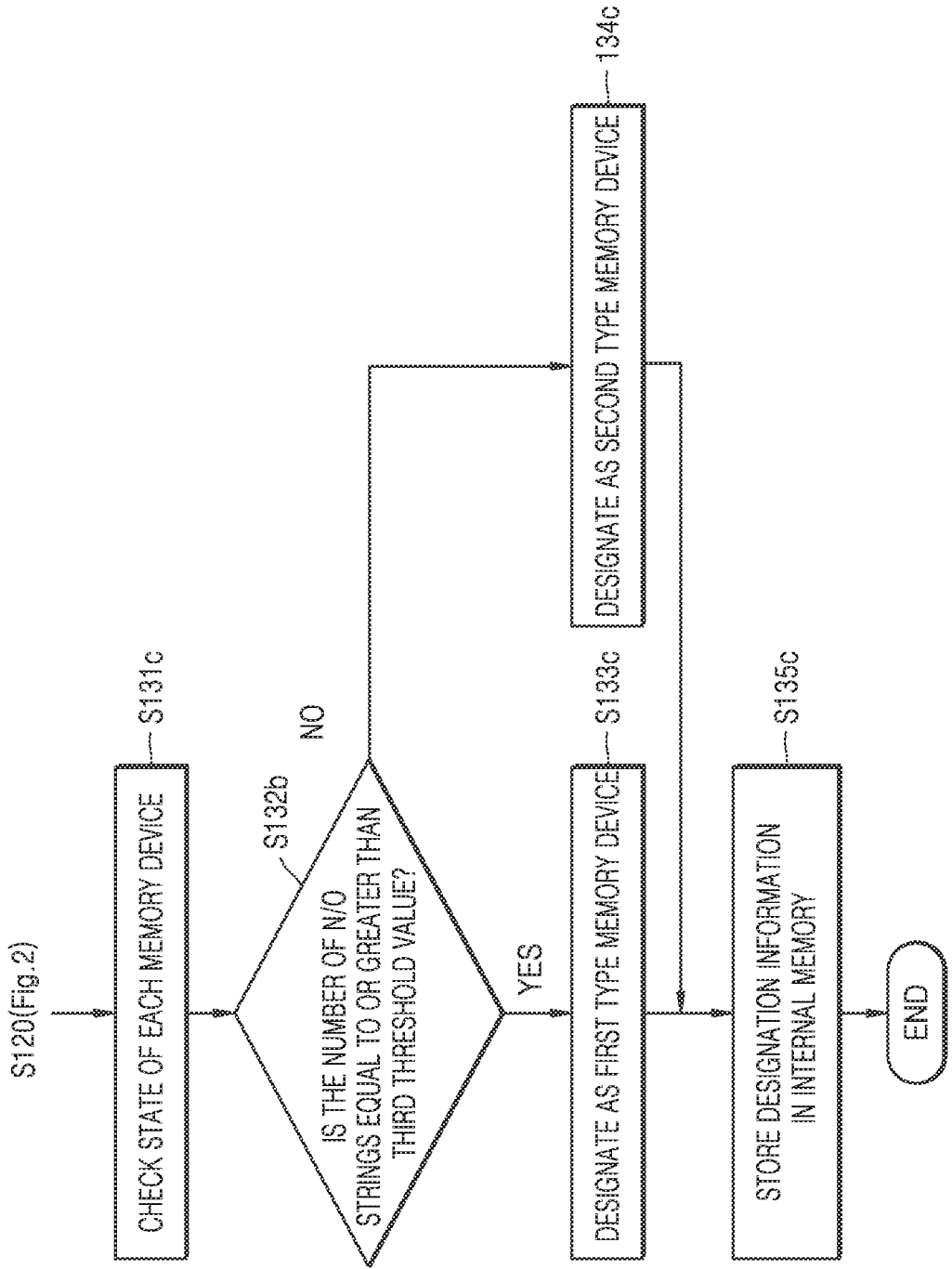
FIG. 16 is a flowchart of a method of operating a memory controller according to an example embodiment of the inventive concept.

FIG. 16 is a flowchart of a method of operating a memory controller according to an example embodiment of the inventive concept. Hereinafter, descriptions will be given with reference to FIG. 14 for convenience of explanation.

Referring to FIG. 16, in operation S131c following operation S120 (FIG. 2), the memory controller 1000 may check the states of each of the memory devices 2000_1 to 2000_n connected to the memory controller 1000 with reference to N/O string information. In operation S132c, the memory controller 1000 may check whether the number of N/O strings included in each of the memory devices 2000_1 to 2000_n is equal to or greater than a third threshold value.

When operation S132c is 'Yes', in operation S133c, the memory controller 100 may designate a memory device having a number of N/O strings equal to or greater than the third threshold value from among the memory devices 2000_1 to 2000_n as a first type memory device. The first type memory device may refer to a memory device operated according to a control scheme considering a state of N/O strings that is not preferable in terms of data reliability. When operation S132c is 'No', in operation S134c, the memory controller 100 may designate a memory device having a number of N/O strings less than the third threshold value from among the memory devices 2000_1 to 2000_n as a second type memory device. The second type memory device may refer to a memory device operated according to a control scheme considering that the second type memory block is capable of supporting higher data reliability than the first type memory block. In operation S135c, the memory controller 1000 may store designation information including results of designating the memory devices 2000_1 to 2000_n in operation S133c and operation S134b in the internal memory 1200.

Figure 17A:
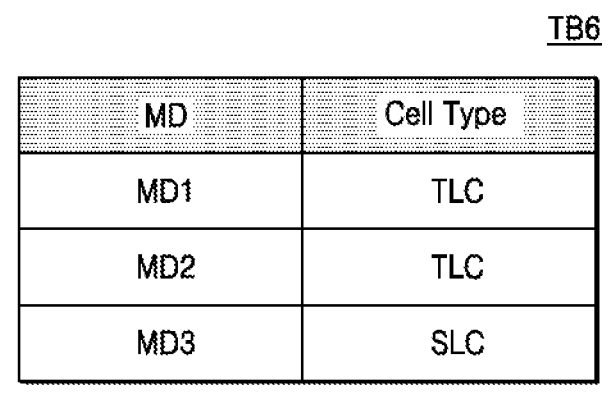
Figure 17B:
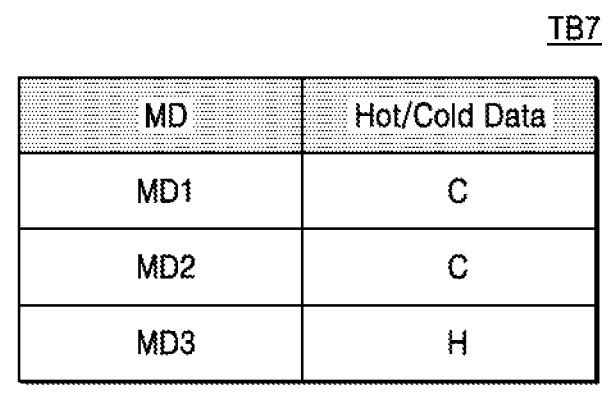

FIGS. 17A and 17B are diagrams for describing the first and second type memory devices of FIG. 16 in detail. Hereinafter, it is assumed that a memory controller designates first and second memory devices MD1 and MD2 each corresponding to the number of N/O strings equal to or greater than the third threshold value as a first type memory device and designates a third memory device MD3 corresponding to the number of N/O strings less than the third threshold value as a second type memory device.

Referring to FIG. 17A, as shown in a second table TB6, the memory controller may operate memory cells of the first and second memory devices MD1 and MD2 as TLC. Also, the memory controller may operate memory cells of the third memory device MD3 as a SLC. In other words, because data reliability supported by a first type memory device corresponding to the number of N/O strings equal to or greater than the third threshold value may be relatively low, memory cells of the first type memory device may be operated as a high-level cell. On the contrary, because data reliability supported by a second type memory device corresponding to the number of N/O strings less than the third threshold value may be relatively high, memory cells of the second type memory device may be operated as a low-level cell.

However, it is merely an example embodiment, and the inventive concept is not limited thereto. The first and second memory devices MD1 and MD2 may also be operated as a multi-level cell or a quad-level cell. Furthermore, memory cells of the first type memory device may be operated as low-level cells, and memory cells of the second type memory device may be operated as higher-level cells than the first type memory device.

Referring to FIG. 17B, as shown in a seventh table TB7, the memory controller may operate the first and second memory devices MD1 and MD2 exclusively to write cold data thereto. Also, the memory controller may operate the third memory device MD3 exclusively to write hot data thereto. In other words, because data reliability supported by a first type memory device corresponding to the number of N/O strings equal to or greater than the third threshold value may be relatively low, the first type memory device may be operated to be exclusively written with cold data that is accessed less frequently than a reference frequency. Because data reliability supported by a second type memory device corresponding to the number of N/O strings less than the third threshold value may be relatively high, the second type memory device may be operated to be exclusively written with hot data that is accessed more frequently than the reference frequency.

Figure 18:
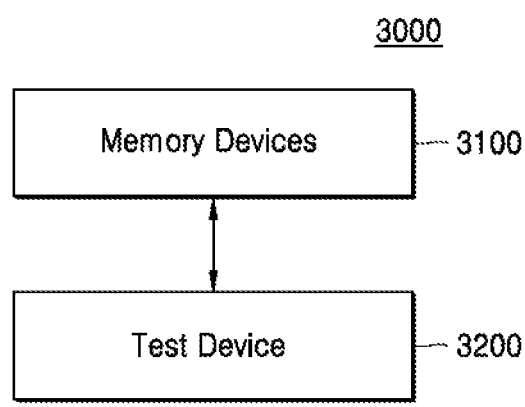
FIG. 18 is a block diagram showing a test system for generating N/O string information according to an example embodiment of the inventive concept.

FIG. 18 is a block diagram showing a test system 3000 for generating N/O string information according to an example embodiment of the inventive concept.

Referring to FIG. 18, the test system 3000 may include a memory device 3100 and a test device 3200. The test device 3200 may generate N/O string information by detecting an N/O string included in each of memory blocks of the memory device 3100. The test device 3200 may store generated N/O string information in the memory device 3100, and N/O string information may be read from a memory controller (not shown), so that operations according to example embodiments of the inventive concept may be performed.

While the inventive concept described herein has been particularly shown and described with reference to example embodiments thereof, it will be understood by those of ordinary skill in the art that various changes in form and details may be made therein without departing from the spirit and scope of the claimed subject matter as defined by the following claims and their equivalent.

What is claimed is:

1. A memory system comprising:
   a memory device comprising a plurality of memory blocks each including a plurality of memory cells stacked in a direction perpendicular to a substrate of the memory device; and
   a memory controller configured to control a memory operation of the memory device,
   wherein the memory controller is configured to designate, among the plurality of memory blocks, a target memory block, which is a first type of memory block having only a first type of memory cells, as a second type of memory block having only a second type of memory cells when the target memory block is determined to include a number of not-open (N/O) strings greater than or equal to a threshold value, and to designate the target memory block as the first type of memory block when the target memory block is determined to include a number of N/O strings less than the threshold value,
   wherein the memory controller operates the target memory block with a first data writing control scheme corresponding to the first type of memory block when the target memory block is designated as the first type of memory block and operates the target memory block with a second, different data writing control scheme corresponding to the second type of memory block when the target memory block is designated as the second type of memory block.

2. The memory system of claim 1, wherein the memory controller is further configured to provide, to the memory device, a first type of command for the target memory block when the number of N/O strings in the target memory block equals or exceeds the threshold value, and to provide a second type of command to the memory device for the target memory block when the number of N/O strings in the target memory block is less than the threshold value.

3. The memory system of claim 2, further comprising control logic configured to detect at least one N/O string from among a plurality of strings included in the target memory block in response to the first type of command and convert a plurality of bits of target data intended to be written to a plurality of target memory cells included in the detected at least one N/O string to have a predetermined value for restricting a number of times for applying a write voltage to the target memory cells.

4. The memory system of claim 2, wherein the second type of command is for a general write operation, and the memory controller is further configured to provide the second type of command to a second memory device to control a write operation for a second target memory block corresponding to the number of N/O strings less than the threshold value from among the plurality of memory blocks.

5. A memory system comprising:
a memory device comprising a plurality of memory blocks each including a plurality of memory cells stacked in a direction perpendicular to a substrate of the memory device; and
a memory controller configured to control a memory operation of the memory device,
wherein the memory controller is configured to respectively select, for each of the plurality of memory blocks and to operate, for each of the plurality of memory blocks, any one of different control schemes based on a number of not-open (N/O) strings included in each of the plurality of memory blocks, and
wherein the memory controller is configured to provide a first type of erase command to erase data in a first manner, to the memory device to erase a first target memory block from among the plurality of memory blocks based on the number of N/O strings of the first memory block being equal to or greater than a threshold number of N/O strings, and to provide a second type of erase command to erase data of a second target memory block of the plurality of memory blocks in a second manner, when a number of N/O strings of the second target memory block is less than the threshold number of N/O strings.

6. The memory system of claim 5, wherein the memory device is configured to perform an erase operation on the first target memory block for a first time period by using an erase voltage of a first level in response to the first type of erase command and to perform an erase operation on the second target memory block for a second time period by using an erase voltage of a second level in response to the second type of erase command.

7. The memory system of claim 6, wherein the first level is higher than the second level, and
the first time period is shorter than the second time period.

8. The memory system of claim 1, wherein the second type of memory block has higher data reliability than the first type of memory block.

9. The memory system of claim 8, wherein the second type of memory block is operated as a lower level cell type of memory block than the first type of memory block.

10. The memory system of claim 8, wherein the first type of memory block is operated, such that cold data, which is accessed less frequently than a reference frequency, is written thereto, and
the second type of memory block is operated, such that hot data, which is accessed more frequently than the reference frequency, is written thereto.

11. The memory system of claim 1, wherein the memory controller is further configured to request first N/O string information related to the number of N/O strings from the memory device, and
the memory device is further configured to provide the first N/O string information to the memory controller in response to the request.

12. The memory system of claim 1, wherein the memory controller is configured to select and operate any one of the first or second data writing control schemes for each of a plurality of sub-blocks defined in the plurality of memory blocks based on the number of N/O strings.

13. The memory system of claim 12, wherein each of the plurality of sub-blocks is classified into a first sub-block not comprising an N/O string and a second sub-block comprising at least one N/O string.

14. The memory system of claim 1, wherein the memory device is a first memory device and the plurality of memory blocks is a plurality of first memory blocks, and the memory system further comprising a second memory device comprising a plurality of second memory blocks each including a plurality of second memory cells stacked in a direction perpendicular to the substrate, and
wherein the memory controller is further configured to select and operate any one of the first or second data writing control schemes for each of the second memory blocks based on second N/O string information regarding a number of N/O strings included in each of the second memory blocks.

15. A memory controller comprising:
an internal memory configured to store not-open (N/O) string information, wherein the stored N/O string information is information regarding a number of N/O strings included in each of a plurality of memory blocks, which are included in an external memory device; and
a processor configured to, based on the stored N/O string information, operate, among the plurality of memory blocks, a target memory block, which is a first type of memory block having only a first type of memory cells, as a second type of memory block having only a second type of memory cells when the target memory block is determined to include a number of N/O strings greater than or equal to a threshold value, and to operate the target memory block as the first type of memory block when the target memory block is determined to include a number of N/O strings less than the threshold value,
wherein the processor operates the target memory block as the first type of memory block using a first data writing control scheme, and operates the target memory block as the second type of memory block using a second, different data writing control scheme.

16. The memory controller of claim 15, wherein the processor is further configured to generate a first type of command having a first code to include detection of the N/O string and conversion of the detected N/O string with respect to target memory cells in a programming sequence for the target memory block and output the first type of command to the external memory device, and generate a second type of command having a second code for normal performance of a programming sequence for a second target memory block and output the second type of command to the external memory device.

17. The memory controller of claim 15, wherein the processor is further configured to generate a first type of erase command having a first code to perform an erase operation for a first target memory block with an erase voltage of a first level for a first time period and output the first type of erase command to the external memory device, and generate a second type of erase command having a second code to perform an erase operation for a second target memory block with an erase voltage of a second level lower than the first level for a second time period longer than the first time period and output the second type of erase command to the external memory device.

18. The memory controller of claim 15, wherein the processor is further configured to operate the second type of memory block as a lower level cell type of memory block than that of the first type of memory block.

19. The memory controller of claim 15, wherein the processor is further configured to operate first target memory blocks, such that cold data, which is accessed less frequently than a reference frequency, is written thereto, and operate the second target memory blocks, such that hot data, which is accessed more frequently than reference frequency, is written thereto.

* * * * *